US012772775B2

(12) United States Patent
Wang et al.

(10) Patent No.: US 12,772,775 B2
(45) Date of Patent: Oct. 20, 2026

(54) DRYING APPARATUS AND METHOD BASED ON SUPERCRITICAL FLUID

(71) Applicant: ACM RESEARCH (SHANGHAI), INC., Shanghai (CN)

(72) Inventors: Hui Wang, Shanghai (CN); Shena Jia, Shanghai (CN); Xiaofeng Tao, Shanghai (CN); Bin He, Beijing (CN); Xin Zhao, Shanghai (CN); Yingnan Sun, Shanghai (CN); Bin Li, Shanghai (CN); Jun Wang, Shanghai (CN); Jian Wang, Shanghai (CN); Fuping Chen, Shanghai (CN); Xiaoyan Zhang, Shanghai (CN); Zhenming Chu, Shanghai (CN); Deyun Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 280 days.

(21) Appl. No.: 18/682,639

(22) PCT Filed: Aug. 9, 2021

(86) PCT No.: PCT/CN2021/111600
§ 371 (c)(1),
(2) Date: Feb. 9, 2024

(87) PCT Pub. No.: WO2023/015417
PCT Pub. Date: Feb. 16, 2023

(65) Prior Publication Data

US 2024/0363370 A1 Oct. 31, 2024

(51) Int. Cl.
*H10P 72/00* (2026.01)
*B08B 3/04* (2006.01)
(Continued)

(52) U.S. Cl.
CPC ............ *H10P 72/0408* (2026.01); *B08B 3/04* (2013.01); *B08B 3/08* (2013.01); *B08B 7/0021* (2013.01);
(Continued)

(58) Field of Classification Search
CPC ..... H10P 72/0408; B08B 3/08; B08B 7/0021; B08B 3/04; H01L 21/67034; H01L 21/67;
(Continued)

(56) References Cited

U.S. PATENT DOCUMENTS 11,594,427 B2 2/2023 Ihara et al.
2008/0011330 A1 1/2008 Kruwinus
(Continued)

FOREIGN PATENT DOCUMENTS

CN 1497667 A 5/2004
CN 101144678 A 3/2008
(Continued)

OTHER PUBLICATIONS

KR20180125764 translation (Year: 2018).*
(Continued)

*Primary Examiner* — Michael E Barr
*Assistant Examiner* — Lauren G Orta
(74) *Attorney, Agent, or Firm* — Osha Bergman Watanabe & Burton LLP

(57) ABSTRACT

A drying apparatus is based on supercritical fluid. The drying apparatus includes: an upper cover; a base, arranged below the upper cover and the base and the upper cover; a substrate tray, arranged on the base; a first fluid supply tube, arranged on the top wall of the upper cover; a fluid disturbance plate, arranged below the first fluid supply tube; a second fluid supply tube, arranged on a first side wall of the upper cover; and a fluid discharge tube, arranged on a second side wall of the upper cover. The inner space of the closed
(Continued)

chamber can be minimized by using the drying apparatus, thereby saving the usage amount of the supercritical fluid, and reducing the usage costs.

22 Claims, 19 Drawing Sheets

(51) Int. Cl.

| | |
|---|---|
| ***B08B 3/08*** | (2006.01) |
| ***B08B 7/00*** | (2006.01) |
| ***H10P 70/00*** | (2026.01) |
| ***H10P 72/30*** | (2026.01) |
| ***H10P 72/70*** | (2026.01) |

(52) U.S. Cl.
CPC .............. *H10P 70/80* (2026.01); *H10P 72/00* (2026.01); *H10P 72/0411* (2026.01); *H10P 72/0461* (2026.01); *H10P 72/3302* (2026.01); *H10P 72/70* (2026.01)

(58) Field of Classification Search
CPC ........... H01L 21/02101; H01L 21/6704; H01L 21/67184; H01L 21/67742; H01L 21/683
See application file for complete search history.

(56) References Cited

U.S. PATENT DOCUMENTS

| | | | | |
|---|---|---|---|---|
| 2009/0020068 | A1 * | 1/2009 | Ode | H01L 21/02164 117/12 |
| 2011/0214694 | A1 | 9/2011 | Toshima et al. | |
| 2012/0073599 | A1 | 3/2012 | Miya et al. | |
| 2020/0049546 | A1 | 2/2020 | Toyomura et al. | |
| 2020/0365437 | A1 * | 11/2020 | Kawahara | B08B 7/0021 |
| 2021/0082691 | A1 | 3/2021 | Fukui et al. | |
| 2021/0159095 | A1 | 5/2021 | Ihara et al. | |
| 2021/0217635 | A1 | 7/2021 | Kim et al. | |

FOREIGN PATENT DOCUMENTS

| | | | | |
|---|---|---|---|---|
| CN | 107275259 | A | 10/2017 | |
| CN | 107881032 | A | 4/2018 | |
| CN | 108022861 | A | 5/2018 | |
| CN | 108269752 | A | 7/2018 | |
| CN | 112151409 | A | 12/2020 | |
| JP | 2005072568 | A | 3/2005 | |
| JP | 2008306175 | A | 12/2008 | |
| JP | 2017183579 | A | 10/2017 | |
| JP | 2018160509 | A | 10/2018 | |
| JP | 2018207103 | A | 12/2018 | |
| JP | 2020024137 | A | 2/2020 | |
| JP | 2021044457 | A | 3/2021 | |
| JP | 2021086857 | A | 6/2021 | |
| KR | 100880696 | B1 | 2/2009 | |
| KR | 20100125733 | A | 12/2010 | |
| KR | 20110080857 | A | 7/2011 | |
| KR | 20180125764 | A * | 11/2018 | H01L 21/6704 |
| KR | 20210064061 | A | 6/2021 | |
| TW | 202125678 | A | 7/2021 | |
| WO | 2020195474 | A1 | 10/2020 | |

OTHER PUBLICATIONS

International Search Report issued for corresponding international patent application No. PCT/CN2021/111600, mailed Apr. 26, 2022 (6 pages).
Written Opinion issued for corresponding international patent application No. PCT/CN2021/111600 mailed Apr. 26, 2022 (7 pages).
Office Action issued in corresponding JP Application No. 2024508445 dated Apr. 11, 2025 (5 pages).
Office Action issued in corresponding TW Application No. 110135816 dated May 14, 2025 (26 pages).
Office Action issued in corresponding EP Application No. 21953055.7 dated Apr. 7, 2025 (2 pages).
Office Action issued in corresponding KR Application No. 20247007759 dated Apr. 22, 2025 (9 pages).
Extended European Search Report issued in corresponding EP Application No. 21953055.7 dated Nov. 28, 2025 (11 pages).
Office Action issued in corresponding JP Application No. 2024508445 dated Oct. 21, 2025 (4 pages).

* cited by examiner

DRYING APPARATUS AND METHOD BASED ON SUPERCRITICAL FLUID

BACKGROUND OF THE INVENTION

Field of the Invention

The present invention relates to the technical field of semiconductor device manufacturing, and particularly relates to a drying apparatus and method based on supercritical fluid.

The Related Art

In the integrated circuit manufacturing process, the wet process of substrates such as wafers is an important process that affects the product yield. In the current wet process, a wafer for wet etching or cleaning is generally held on a wafer chuck, and the wafer is rotated by the wafer chuck, and the surface of the wafer is processed by spraying the wet chemical solution. After the wet etching or cleaning process, the substrate needs to be performed drying process.

Currently, traditional drying processes mostly use nitrogen or isopropyl alcohol (IPA) to perform drying process to a substrate. However, during the drying process of the substrate, using nitrogen to perform drying process to the substrate can easily blow down fine pattern structures on the substrate, causing damage to the substrate. Moreover, while using nitrogen and IPA to perform drying process to the substrate, the IPA attached to substrate surface can easily cause the fine pattern structures on the substrate to collapse due to the surface tension of IPA, thus causing the substrate to be damaged.

In order to avoid the substrate being damaged during the drying process, a drying process based on supercritical fluid with zero surface tension is used, covering the substrate surface with IPA, and replacing the IPA on the substrate surface by the supercritical fluid, to make the substrate surface be covered by supercritical fluid. Subsequently, the volatilization of the supercritical fluid with zero surface tension will not cause the fine pattern structures on the substrate to collapse, thereby avoiding damage to the substrate.

Chinese patent application No. 200710108454.0 disclosed a drying apparatus on Jun. 14, 2007, which forms a closed chamber after a substrate entered the chamber from above and injects supercritical fluid into the closed chamber from the side of the closed chamber, to make the environment in which the substrate is located reach a supercritical state, and to perform drying process to the substrate in the supercritical state. Another Chinese patent application No. 201711066490.5 disclosed a drying apparatus on Nov. 2, 2017, which forms a closed chamber after a substrate entered the chamber from the side and injects supercritical fluid into the closed chamber from the bottom and the other side of the closed chamber to perform drying process to the substrate.

However, the above two drying apparatuses loading the substrate into a closed chamber from above or from the side have problems such as low process efficiency, large inner space of the closed chamber causing large usage of supercritical fluid.

Therefore, it is necessary to propose a new drying apparatus and method based on supercritical fluid to solve the above-mentioned problems.

SUMMARY

In view of the above shortcomings of the prior art, the purpose of the present invention is to provide a drying apparatus and method based on supercritical fluid to solve the problems in the prior art, including low process efficiency, large usage of supercritical fluid due to large inner space of the closed chamber.

In order to achieve the above objects and other related objects, the present invention provides a drying apparatus based on supercritical fluid, comprising:

an upper cover;

a base, arranged below the upper cover, the base and the upper cover being capable of moving relatively in the vertical direction so as to close to form a pressure-resistant closed chamber;

a substrate tray, arranged on the base, and configured to bear a substrate;

a first fluid supply tube, arranged on the top wall of the upper cover, and configured to supply supercritical fluid to the interior of the closed chamber, to make the closed chamber reach a supercritical state from an atmospheric pressure state;

a fluid disturbance plate, arranged below the first fluid supply tube;

a second fluid supply tube, arranged on a first side wall of the upper cover, and configured to supply supercritical fluid to the interior of the closed chamber in the supercritical state, so as to perform drying process to the substrate inside the closed chamber;

and a fluid discharge tube, arranged on a second side wall of the upper cover.

The above-mentioned drying apparatus based on supercritical fluid, wherein a gap between the fluid disturbance plate and the substrate is less than a set value.

The above-mentioned drying apparatus based on supercritical fluid, wherein the set value is 0-10 mm.

The above-mentioned drying apparatus based on supercritical fluid, wherein a plurality of first through holes are evenly and horizontally distributed on the first side wall of the upper cover, and the plurality of first through holes are connected to the second fluid supply tube, which are used for the supercritical fluid evenly entering the interior of the closed chamber through the plurality of first through holes.

The above-mentioned drying apparatus based on supercritical fluid, wherein a first cavity is provided on the first side wall of the upper cover, and the bottom surface of the first cavity is parallel to the upper surface of the substrate, which are used for the supercritical fluid that enters from the first through holes being evenly distributed on the upper surface of the substrate after passing through the first cavity.

The above-mentioned drying apparatus based on supercritical fluid, wherein the first through holes are conical holes.

The above-mentioned drying apparatus based on supercritical fluid, wherein a plurality of second through holes are evenly and horizontally distributed on the second side wall of the upper cover, and the plurality of second through holes are connected to the fluid discharge tube.

The above-mentioned drying apparatus based on supercritical fluid, wherein a second cavity is provided on the second side wall of the upper cover, and the bottom surface of the second cavity is parallel to the upper surface of the substrate.

The above-mentioned drying apparatus based on supercritical fluid, wherein the second through holes are conical holes.

The above-mentioned drying apparatus based on supercritical fluid, wherein the tube diameter of the second fluid supply tube is larger than the tube diameter of the first fluid supply tube.

The above-mentioned drying apparatus based on supercritical fluid, wherein the upper cover is fixed and the base is adapted to move upward in the vertical direction, so as to close to form the closed chamber.

The above-mentioned drying apparatus based on supercritical fluid, wherein the base is fixed and the upper cover is adapted to move downward in the vertical direction, so as to close to form the closed chamber.

The above-mentioned drying apparatus based on supercritical fluid, wherein locks are provided on the upper cover, which are used for fastening the base when the upper cover and the base move relatively to form the closed chamber, thereby locking the closed chamber.

The above-mentioned drying apparatus based on supercritical fluid, wherein the appearance of the upper cover is a square cover, the base is a square plate, and the hollow part of the closed chamber is a circular shape chamber.

The above-mentioned drying apparatus based on supercritical fluid, wherein the supercritical fluid is supercritical carbon dioxide.

The above-mentioned drying apparatus based on supercritical fluid, wherein the base and the substrate tray are integrally formed.

The present invention also provides a drying method based on supercritical fluid, comprising the following steps:

- step S1: placing a substrate to be dried on a substrate tray, and making a base and an upper cover move relative to each other in a vertical direction, so as to close to form a pressure-resistant closed chamber;
- step S2: suppling supercritical fluid from above the closed chamber through a first fluid supply tube, and the fluid reaching the upper surface of the substrate from the side of the substrate after bypassing a fluid disturbance plate below the first fluid supply tube, after making the closed chamber reach a supercritical state, stopping the supercritical fluid supply from above the closed chamber;
- step S3: suppling supercritical fluid from a first side of the closed chamber through a second fluid supply tube to perform drying process to the substrate;
- step S4: after the drying process being completed, closing the second fluid supply tube, reducing the inner pressure of the closed chamber and converting the supercritical fluid into gas that is discharged from a second side of the closed chamber through a fluid discharge tube;
- step S5: opening the closed chamber and taking out the substrate when the inner pressure of the closed chamber reaches the state of atmospheric pressure.

The above-mentioned drying method based on supercritical fluid, wherein before taking out the substrate in step S5, a plurality of loop operations from steps S2 to S4 are performed.

The above-mentioned drying method based on supercritical fluid, wherein the second fluid supply tube supplies the supercritical fluid from the first side of the closed chamber at a flow rate angle parallel to the upper surface of the substrate.

The above-mentioned drying method based on supercritical fluid, wherein the fluid discharge tube discharges the supercritical fluid at a flow rate angle parallel to the upper surface of the substrate.

The above-mentioned drying method based on supercritical fluid, wherein the flow rate of the supercritical fluid supplied by the second fluid supply tube is greater than the flow rate of the supercritical fluid supplied by the first fluid supply tube.

The present invention also provides a cleaning and drying equipment, comprising:

- a substrate loading port, configured to place a substrate;
- a buffer device;
- a front-end robot, configured to transfer the substrate between the substrate loading port and the buffer device;
- a cleaning chamber, configured to perform cleaning process to the substrate;
- a drying apparatus based on supercritical fluid, configured to perform drying process to the cleaned substrate; the drying apparatus comprising:
- an upper cover;
- a base, arranged below the upper cover and adapted to move relative to the upper cover in a vertical direction, so as to close to form a pressure-resistant closed chamber;
- a substrate tray, arranged on the base, and configured to bear a substrate;
- a first fluid supply tube, arranged on the top wall of the upper cover, and configured to supply supercritical fluid to the interior of the closed chamber, to make the closed chamber reach a supercritical state from an atmospheric pressure state;
- a fluid disturbance plate, arranged below the first fluid supply tube;
- a second fluid supply tube, arranged on a first side wall of the upper cover, and configured to supply the supercritical fluid to the interior of the closed chamber in the supercritical state, so as to perform drying process to the substrate inside the closed chamber;
- a fluid discharge tube, arranged on a second side wall of the upper cover;
- a process robot, configured to transfer the substrate among the buffer device, the cleaning chamber and drying apparatus.

The above-mentioned cleaning and drying equipment, wherein there are a plurality of drying apparatuses, which are symmetrically arranged at both sides of the process robot; there are a plurality of cleaning chambers, which are arranged above or below the drying apparatuses and correspond to the drying apparatuses one by one.

The above-mentioned cleaning and drying equipment, wherein there are six drying apparatuses, and three drying apparatuses are arranged at a side of the process robot, the other three drying apparatuses are arranged at the other side of the process robot; there are six cleaning chambers, which correspond to the drying apparatuses one by one.

The above-mentioned cleaning and drying equipment, wherein the drying apparatuses are arranged at a first side of the process robot; the cleaning chambers are arranged at a second side of the process robot; and the drying apparatuses correspond to the cleaning chambers one by one.

The above-mentioned cleaning and drying equipment, wherein the cleaning chambers are used for single substrate cleaning or batch substrates cleaning.

The above-mentioned cleaning and drying equipment, wherein the cleaning chambers comprise one or more of the following structures for batch substrates cleaning: a chemical liquid cleaning tank, a rapid deionized water rinse tank, an IPA tank and a flipping IPA wetting mechanism.

The above-mentioned cleaning and drying equipment, wherein there are a plurality of drying apparatuses, which are distributed in a plurality of layers in the vertical direction at a first side of the process robot; there are a plurality of cleaning chambers, which are distributed in a plurality of layers in the vertical direction at a second side of the process robot.

The above-mentioned cleaning and drying equipment, wherein there are six drying apparatus, and the six drying apparatus are distributed in two layers in the vertical direction at the first side of the process robot; there are six cleaning chambers, and the six cleaning chambers are distributed in two layers in the vertical direction at the second side of the process robot.

The present invention also provides a cleaning and drying equipment, comprising:

a substrate loading port, configured to place a substrate;

a buffer device;

a front-end robot, configured to transfer the substrate between the substrate loading port and the buffer device;

a cleaning chamber, configured to perform cleaning process to the substrate;

a drying apparatus based on supercritical fluid, configured to perform drying process to the cleaned substrate;

a process robot, configured to transfer the substrate among the buffer device, the cleaning chamber and the drying apparatus;

wherein there are a plurality of drying apparatuses, which are symmetrically arranged at both sides of the process robot;

there are a plurality of cleaning chambers, which are arranged above or below the drying apparatuses and correspond to the drying apparatuses one by one.

The present invention also provides a cleaning and drying equipment, comprising:

a substrate loading port, configured to place a substrate;

a buffer device;

a front-end robot, configured to transfer the substrate between the substrate loading port and the buffer device;

a cleaning chamber, configured to perform cleaning process to the substrate;

a drying apparatus based on supercritical fluid, configured to perform drying process to the cleaned substrate;

a process robot, configured to transfer the substrate among the buffer device, the cleaning chamber and the drying apparatus;

wherein the drying apparatus is arranged at a first side of the process robot; the cleaning chamber is arranged at a second side of the process robot; the drying apparatus corresponds to the cleaning chamber one by one.

The above-mentioned cleaning and drying equipment, wherein there are a plurality of drying apparatuses, which are distributed in a plurality of layers in the vertical direction at the first side of the process robot; and there are a plurality of cleaning chambers, which are distributed in a plurality of layers in the vertical direction at the second side of the process robot.

The above-mentioned cleaning and drying equipment, wherein the cleaning chamber is used for single substrate cleaning or batch substrates cleaning.

The above-mentioned cleaning and drying equipment, wherein the cleaning chamber comprises one or more of the following structures for batch substrates cleaning: a chemical liquid cleaning tank, a rapid deionized water rinse tank, an IPA tank and a flipping IPA wetting mechanism.

As described above, compared with the prior art, the drying apparatus and method based on supercritical fluid proposed by the present invention have the following beneficial effects:

1. In the drying apparatus based on supercritical fluid provided by the present invention, by placing the substrate on the base and making the base and the upper cover move relative to each other to form a closed chamber, the inner space of the closed chamber can be minimized, thereby saving the usage amount of the supercritical fluid, and reducing the usage costs.
2. In the drying apparatus based on supercritical fluid provided by the present invention, by arranging a fluid disturbance plate between the first fluid supply tube and the substrate, it is avoided that the supercritical fluid through the first fluid supply tube is directly sprayed on the substrate surface to blow off the IPA on the substrate surface, causing damage to the substrate.
3. In the drying apparatus based on supercritical fluid provided by the present invention, a plurality of the first through holes and the second through holes are evenly provided on the side walls of the upper cover, respectively connected to the second fluid supply tube and the fluid discharge tube, thereby increasing the circulation efficiency of the second fluid supply tube and the fluid discharge tube, and effectively improving the process efficiency of the drying process to the substrate.
4. In the drying apparatus based on supercritical fluid provided by the present invention, the first cavity and the second cavity respectively connected to the first through holes and the second through holes are provided on the side walls of the upper cover. And the first cavity and the second cavity are parallel to the upper surface of the substrate, so that supercritical fluid entered through the first through holes can be evenly distributed on the upper surface of the substrate through the first cavity. The supercritical fluid during the drying process and the fluid in the closed chamber after the drying process quickly discharge out of the closed chamber through the second cavity and the second through holes, which improves the process rate of the supercritical fluid drying process and effectively improves the process efficiency of the drying process to substrate.

BRIEF DESCRIPTION OF THE DRAWINGS

The features and performance of the present invention are further described in the following embodiments and accompanying drawings.

DETAILED DESCRIPTION OF EMBODIMENTS

Figure 1A:
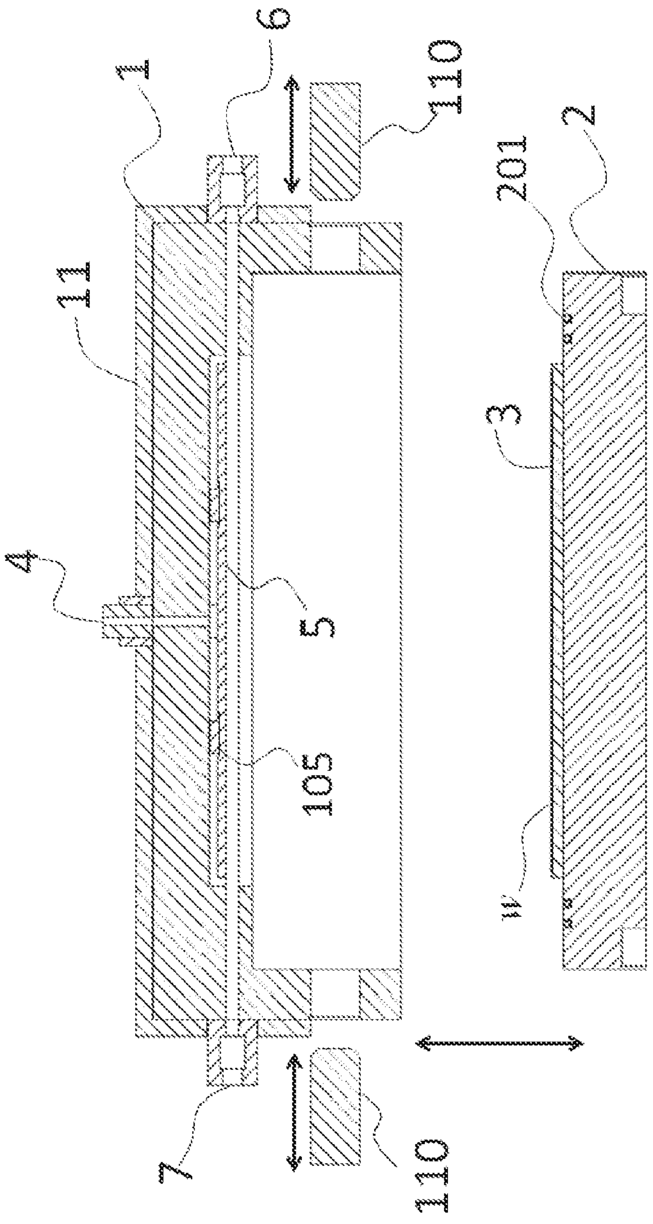
FIG. 1A is a structural schematic diagram of a drying apparatus based on supercritical fluid provided in Embodiment 1 of the present invention.

The following describes the embodiments of the present invention through specific examples, those skilled in the art can easily understand other advantages and effects of the present invention from the content disclosed in this specification. The present invention can also be implemented or applied through other different specific embodiments. And various details in this specification can also be modified or changed in various ways based on different viewpoints and applications without departing from the spirit of the present invention.

Please refer to FIG. 1A to FIG. 11. It should be noted that the diagrams provided in this embodiment only illustrate the basic concept of the present invention in a schematic manner. Although the diagrams only show the components related to the present invention and are not drawn according to the number, shape and size of the components during actual implementation, in actual implementation, the shape, quantity and proportion of each component can be changed at will, and the components layout patterns may also be more complex.

Embodiment 1

Please refer to FIG. 1A to FIG. 8B. The Embodiment 1 provides a drying apparatus based on supercritical fluid used for performing drying process to a cleaned substrate w; and in this embodiment, the surface of the cleaned substrate w is covered with a layer of IPA.

As shown in FIG. 1A to FIG. 4, the drying apparatus based on supercritical fluid comprises: an upper cover 1; a base 2, arranged below the upper cover 1, the base 2 and the upper cover 1 can move relatively in the vertical direction, so as to close to form a pressure-resistant closed chamber 120; a substrate tray 3, arranged on the base 2 and configured to bear a substrate w; when the upper cover 1 and the base 2 are closed to form the closed chamber 120, the substrate w is located inside the closed chamber 120 to perform drying process to the substrate w whose surface is covered with IPA; a first fluid supply tube 4, arranged on the top wall of the upper cover 1 and configured to supply supercritical fluid to the interior of the closed chamber 120; the continuous addition of drying fluid causing the pressure inside the closed chamber 120 to continuously increase, until the pressure of the closed chamber 120 increasing to above the critical pressure of the dry fluid and to make the dry fluid reach a supercritical state; a fluid disturbance plate 5, arranged below the first fluid supply tube 4, and located between the first fluid supply tube 4 and substrate w, to make the supercritical fluid that enters from the first fluid supply tube 4 reach the upper surface of the substrate w from the side of the substrate w after bypassing the fluid disturbance plate 5, effectively buffering the impact of the supercritical fluid, and avoiding excessive flow of supercritical fluid being directly sprayed onto the upper surface of the substrate w to blow off the IPA on the surface of the substrate w; a second fluid supply tube 6, arranged on a first side wall of the upper cover 1, and configured to supply the supercritical fluid to the interior of the closed chamber 120 in a supercritical state, to make the supercritical fluid be replaced with the IPA covering the surface of the substrate w, and performing drying process to the surface of the substrate w inside the closed chamber 120; and a fluid discharge tube 7, arranged on a second side wall of the upper cover 1.

Wherein, when the first fluid supply tube 4 is opened, with the supply of supercritical fluid, the air and fluid inside the closed chamber 120 are discharged from the closed chamber 120 through the fluid discharge tube 7, to make all the air in the closed chamber 120 is replaced by the fluid. And the supply of supercritical fluid is continuously increase, causing the pressure inside the closed chamber 120 to increase to above the critical pressure. After the interior of the closed chamber 120 reaches the supercritical state, the first fluid supply tube 4 is closed, and the supercritical fluid supply from above the closed chamber 120 is stopped.

When the second fluid supply tube 6 is opened, the supercritical fluid performs drying process to the substrate inside the closed chamber 120, at this time, the fluid discharged from the fluid discharge tube 7 is supercritical fluid.

After the drying process is completed, the second fluid supply tube 6 is closed, the fluid in the closed chamber 120 is continuously discharged from the fluid discharge tube 7, which reduces the inner pressure of the closed chamber 120 and makes the supercritical fluid be converted into gas that is discharged from the closed chamber 120 through the fluid discharge tube 7.

By placing the substrate w on the base 2, and making the base 2 and the upper cover 1 move relatively to form the closed chamber 120, the inner space of the closed chamber 120 can be minimized, thereby saving the usage amount of the supercritical fluid, and reducing the usage costs.

As shown in FIG. 1A to FIG. 2B, by arranging the fluid disturbance plate 5 between the first fluid supply tube 4 and the substrate w, it is avoided that the supercritical fluid is directly sprayed on the surface of the substrate w through the first fluid supply tube 4 to blow off the IPA on the surface of the substrate w.

The gap between the fluid disturbance plate 5 and the substrate w is less than a set value; wherein the set value is 0-10 mm. In this embodiment, the optimal set value is 2 mm. In order to make the inner space of the closed chamber 120 is further reduced, the set value can be set smaller, such as 1 mm. The smaller the gap between the fluid disturbance plate 5 and the substrate w, the smaller the inner space of the closed chamber 120 will be, and the higher the replacement efficiency of the supercritical fluid between the IPA of the surface of the substrate w inside the closed chamber 120 will be. Therefore, while effectively improving the process efficiency of the drying process to the surface of the substrate w, it also saves the usage amount of the supercritical fluid, thus reducing the usage costs.

Figure 1B:
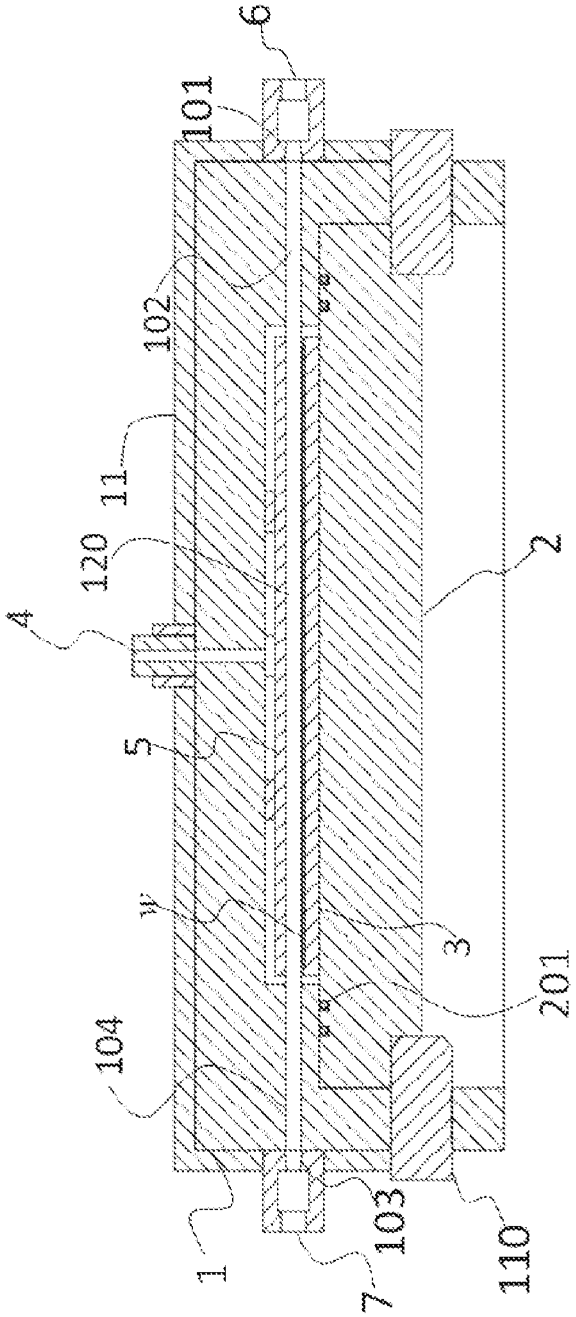
FIG. 1B is another structural schematic diagram of the drying apparatus based on supercritical fluid provided in Embodiment 1 of the present invention.

As shown in FIG. 1A and FIG. 1B, the base 2 and the upper cover 1 move relatively to each other in the vertical direction, so as to close to form the pressure-resistant closed chamber 120. In this embodiment, the upper cover 1 is fixed, and the base 2 moves upward in the vertical direction, so as to close to form the pressure-resistant closed chamber 120. In one embodiment, the substrate tray 3 and the base 2 may be integrally formed.

Figure 2A:
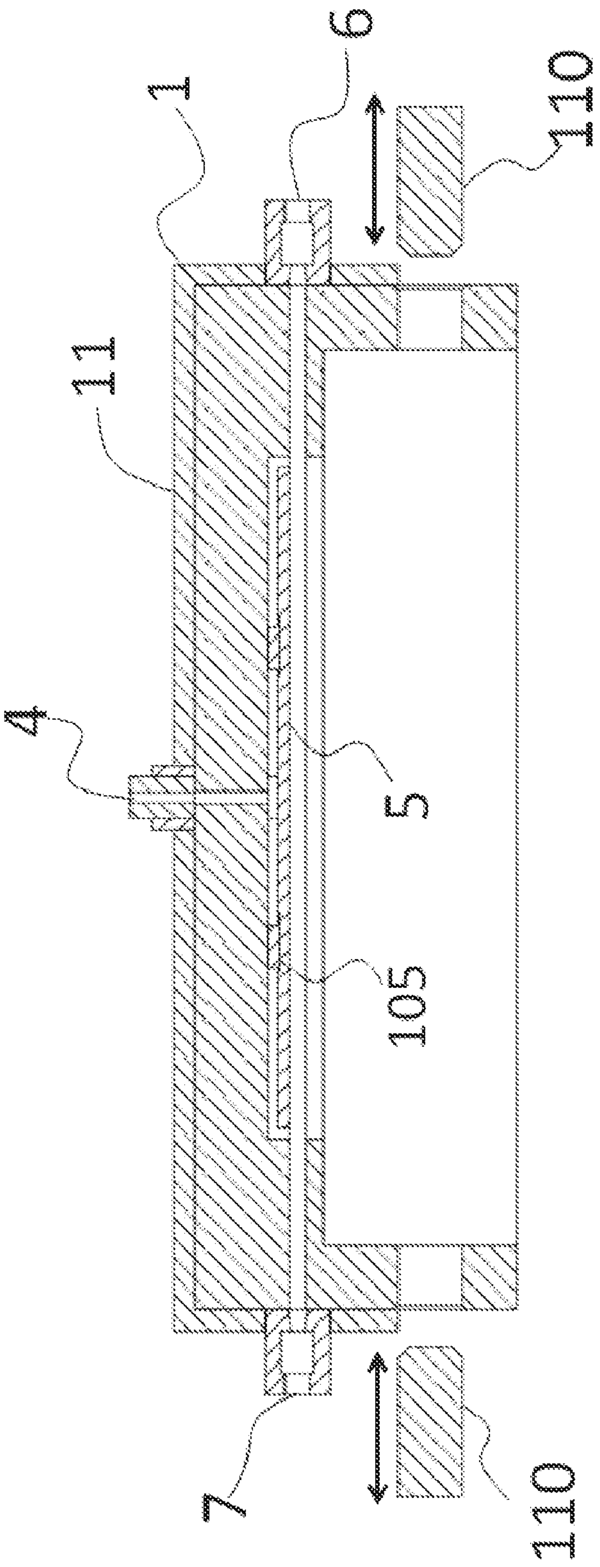
FIG. 2A is a structural schematic diagram of an upper cover provided in Embodiment 1 of the present invention.

As shown in FIG. 1A, FIG. 1B and FIG. 2A, locks 110 are provided on the upper cover 1, which are used for fastening the base 2 when the upper cover 1 and the base 2 move relatively to form the closed chamber 120, thereby locking the closed chamber 120, enhancing the pressure resistance of the closed chamber 120. In other embodiments, locks can also be provided on the base 2 to lock the closed chamber 120.

As shown in FIG. 1A and FIG. 1B, in this embodiment, the appearance of the upper cover 1 is a square cover, the base 2 is a square plate, and the hollow part of the closed chamber 120 is a circular shape configured to accommodate the substrate w and the substrate tray 3. Setting the hollow part of the closed chamber 120 in a circular shape can reduce the inner space of the closed chamber 120, thereby saving the usage amount of the supercritical fluid, and reducing the usage costs.

As shown in FIG. 1A, FIG. 1B and FIG. 2A, the tube diameter of the second fluid supply tube 6 is larger than the tube diameter of the first fluid supply tube 4, to make the flow rate of the supercritical fluid supplied by the second fluid supply tube 6 is greater than the flow rate of the supercritical fluid supplied by the first fluid supply tube 4. The first fluid supply tube 4 supplies a small flow rate of supercritical fluid, which ensures that the IPA on the surface of the substrate w will not be blown off when the supercritical fluid is slowly entered through the first fluid supply tube 4. The second fluid supply tube 6 supplies a larger flow rate of supercritical fluid, which speeds up the efficiency of the second fluid supply tube 6 in supplying the supercritical fluid, further improves the speed of the supercritical fluid drying process, and improves the efficiency of the supercritical fluid drying process to the substrate w.

Figure 2B:
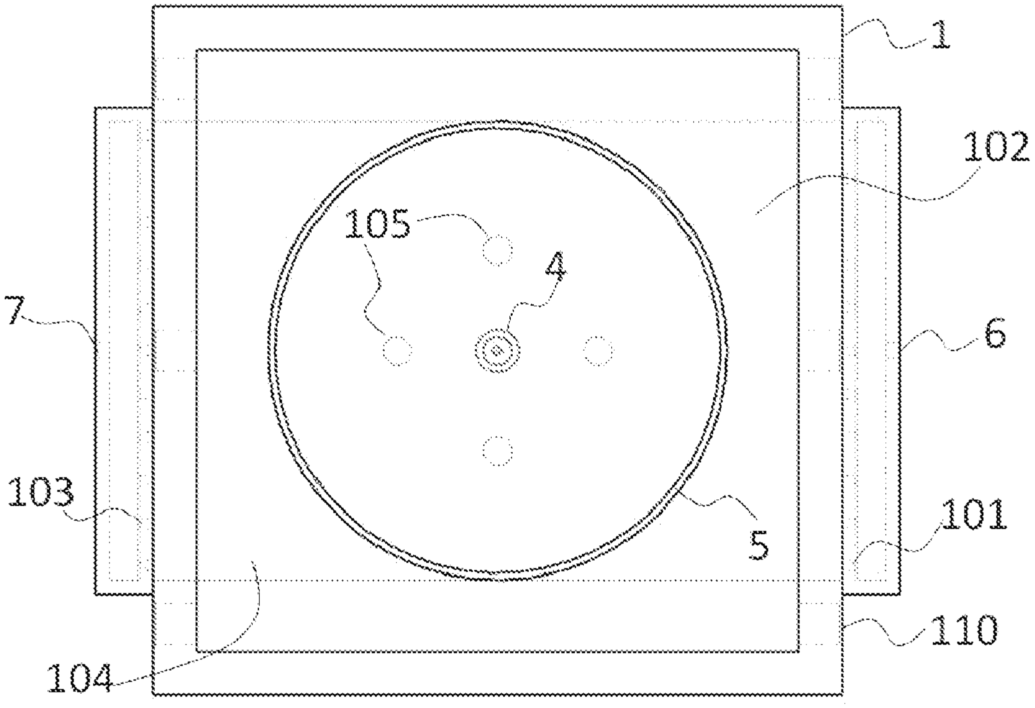
FIG. 2B is a bottom view of the upper cover provided in Embodiment 1 of the present invention.
Figure 3:
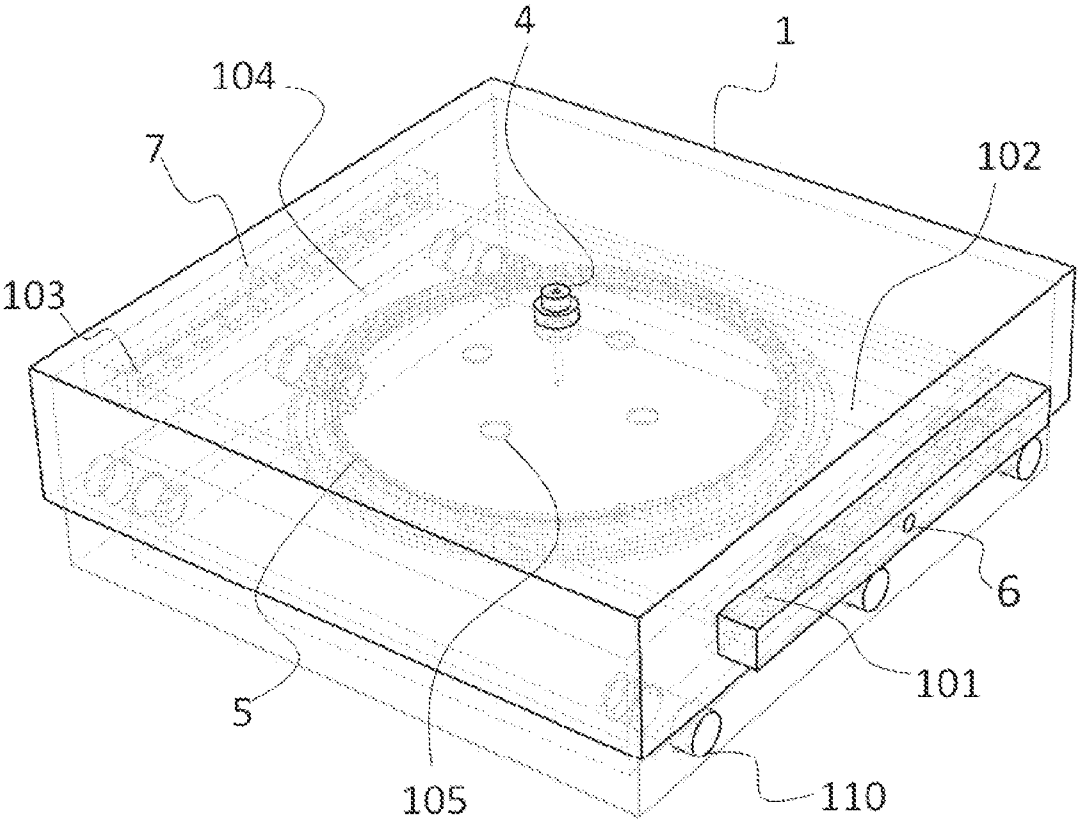
FIG. 3 is a perspective diagram of the drying apparatus based on supercritical fluid provided in Embodiment 1 of the present invention.

As shown in FIG. 2B to FIG. 3, a plurality of first through holes 101 are evenly and horizontally distributed on the first side wall of the upper cover 1, and the plurality of first through holes 101 are connected to the second fluid supply tube 6. The supercritical fluid evenly enters the interior of the closed chamber 120 through the plurality of first through holes 101, so that the supercritical fluid can quickly and evenly enter the interior of the closed chamber 120 through the plurality of first through holes 101, which effectively speeds up the supply efficiency of supercritical fluid, further improves the speed of the supercritical fluid drying process, and improves the process efficiency of drying process to the surface of the substrate w.

Figure 4:
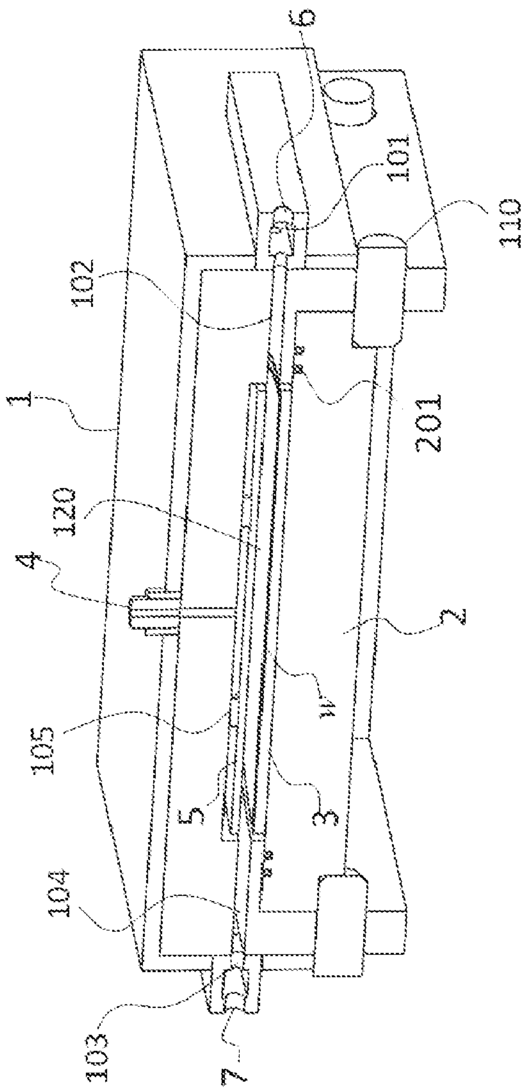
FIG. 4 is a sectional view of the drying apparatus based on supercritical fluid provided in Embodiment 1 of the present invention.
Figure 5A:
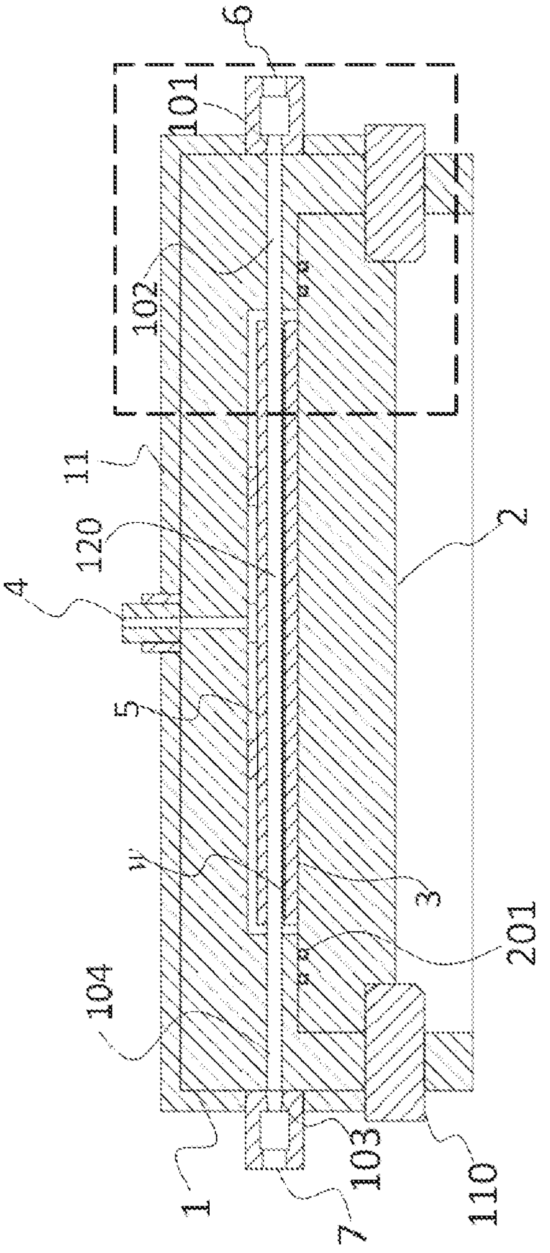
FIG. 5A is a sectional view of the drying apparatus based on supercritical fluid provided in Embodiment 1 of the present invention.
Figure 5B:
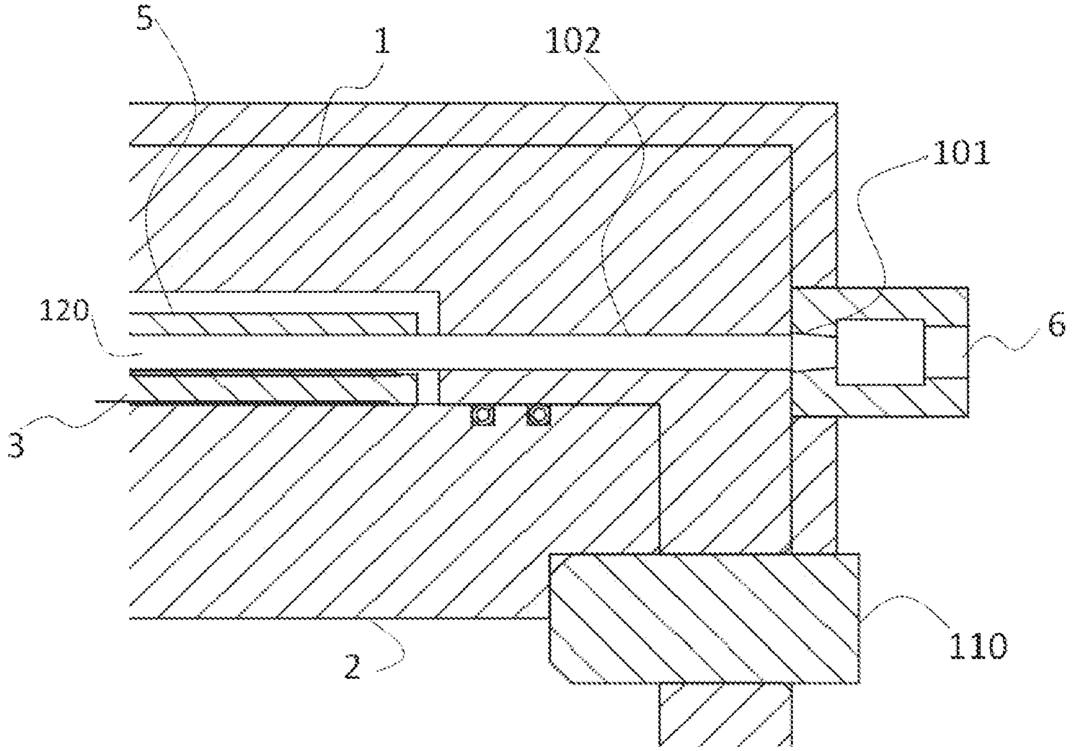
FIG. 5B is an enlarged diagram of the dotted box in FIG. 5A in Embodiment 1 of the present invention.

As shown in FIG. 2B to FIG. 5B, a first cavity 102 is also provided on the first side wall of the upper cover 1, and the first cavity 102 is connected to the plurality of first through holes 101. The supercritical fluid entering through the plurality of first through holes 101 can be dispersed inside the first cavity 102, and the dispersed supercritical fluid can be more evenly distributed on the upper surface of the substrate w to avoid the phenomenon that the surface of the substrate w receives the supercritical fluid unevenly. Moreover, as shown in FIG. 5B, which is an enlarged diagram of the dotted box in FIG. 5A, the bottom surface of the first cavity 102 is parallel to the upper surface of the substrate w. More preferably, the bottom surface of the first cavity 102 is flush with the upper surface of the substrate w. Thus, the supercritical fluid entered from the first through holes 101 can act parallelly to the upper surface of the substrate w through the first cavity 102, thereby saving the usage amount of supercritical fluid and avoiding the waste of supercritical fluid.

In this embodiment, as shown in FIG. 5B, the first through holes 101 are conical holes, and the opening of one end of the first through holes 101 toward the first cavity 102 is larger, which is configured to increase the efficiency of the supercritical fluid passed through the first through holes 101 and further improve the process rate of the drying process to the surface of the substrate w.

Similarly, as shown in FIG. 2B to FIG. 5B, a plurality of second through holes 103 are evenly and horizontally distributed on the second side wall of the upper cover 1, and the second through holes 103 are connected to the fluid discharge tube 7, so that the fluid can be quickly discharged from the closed chamber 120 through the plurality of second through holes 103, which effectively speeds up the discharge rate of the fluid, further increases the speed of the supercritical fluid drying process, and improves the process efficiency of the drying process to the surface of the substrate w.

Meanwhile, as shown in FIG. 5A, a second cavity 104 is provided on the second side wall of the upper cover 1, and the bottom surface of the second cavity 104 is parallel to the upper surface of the substrate w. More preferably, the bottom surface of the second cavity 104 is flush with the upper surface of the substrate w, so that the fluid in the closed chamber 120 can be discharged from the closed chamber 120 evenly and quickly through the second cavity 104 and the plurality of second through holes 103, which speeds up the process of supercritical fluid drying process and improves the process efficiency.

In this embodiment, as shown in FIG. 5B, the second through holes 103 are conical holes, and the opening of one end of the second through holes 103 toward the second cavity 104 is larger, which is configured to increase the efficiency of the supercritical fluid discharged from the second through holes 103 and further improve the process rate of the drying process to the surface of the substrate w.

In this embodiment, a plurality of first through holes 101 and a plurality of second through holes 103 are evenly provided on both side walls of the upper cover 1, respectively connected to the second fluid supply tube 6 and the fluid discharge tube 7, effectively increasing circulation efficiency of the second fluid supply tube 6 and the fluid discharge tube 7, to make the supercritical fluid and the processed fluid to quickly pass into and out of the closed chamber 120 respectively, thus improving the process rate of the supercritical fluid drying process and effectively improving the process efficiency of the drying process to the surface of substrate w.

In addition, in this embodiment, the first cavity 102 and the second cavity 104 whose bottom surfaces are parallel to the upper surface of the substrate w are respectively provided, ensuring that the supercritical fluid entered from the first through holes 101 can be evenly distributed on the upper surface of the substrate w through the first cavity 102, and the supercritical fluid can be evenly discharged from the second through holes 103 through the second cavity 104, which improves the process rate of the supercritical fluid drying process and effectively improves the process efficiency of the drying process to the surface of substrate w.

The thickness of the first cavity 102 and the second cavity 104 (the vertical dimension in the figures) is substantially consistent with the gap between the fluid disturbance plate 5 and the substrate w. When the gap between the fluid disturbance plate 5 and the substrate w becomes smaller, the thickness of the first cavity 102 and the second cavity 104 can be reduced accordingly to reduce the inner space of the closed chamber 120, thereby saving the usage amount of the supercritical fluid, and reducing the usage costs.

As shown in FIG. 1 to FIG. 5, a plurality of connecting components 105 are provided between the upper cover 1 and the fluid disturbance plate 5 for connecting the fluid disturbance plate 5 and the upper cover 1. In this embodiment, there are four connecting components 105, evenly distributed around the first fluid supply tube 4.

Figure 6:
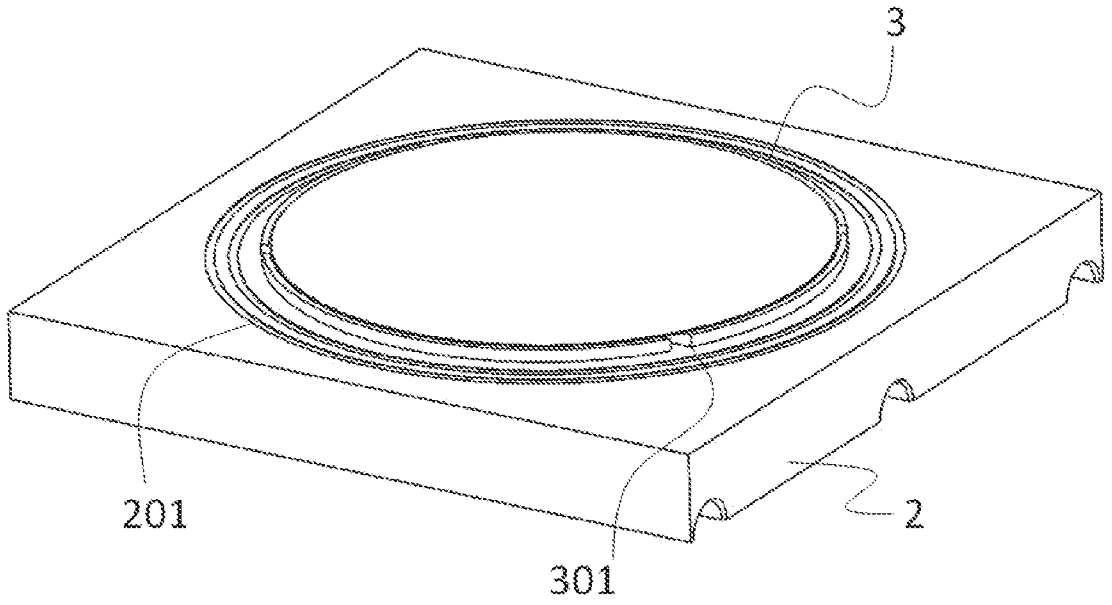
FIG. 6 is a structural schematic diagram of a base and a substrate tray provided in Embodiment 1 of the present invention.

As shown in FIG. 6, a plurality of grooves 301 are provided on the substrate tray 3 to facilitate a plurality of support members 9 to take the substrate w from or load the substrate w on the substrate tray 3, and the number of grooves 301 is consistent with the number of support members 9. In this embodiment, the number of grooves 301 is four; as shown in FIG. 7B and FIG. 8B, the number of support members 9 is four.

Figure 7A:
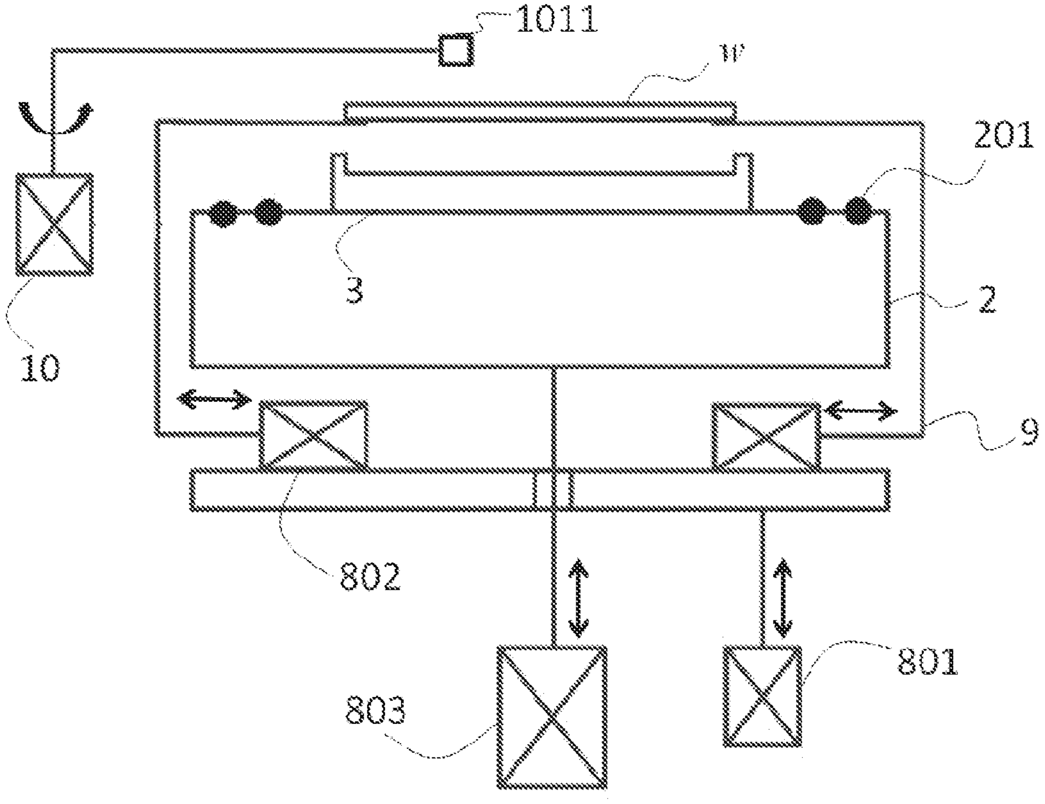
FIG. 7A is a schematic diagram of placing a substrate on the substrate tray using support members provided in Embodiment 1 of the present invention.
Figure 7B:
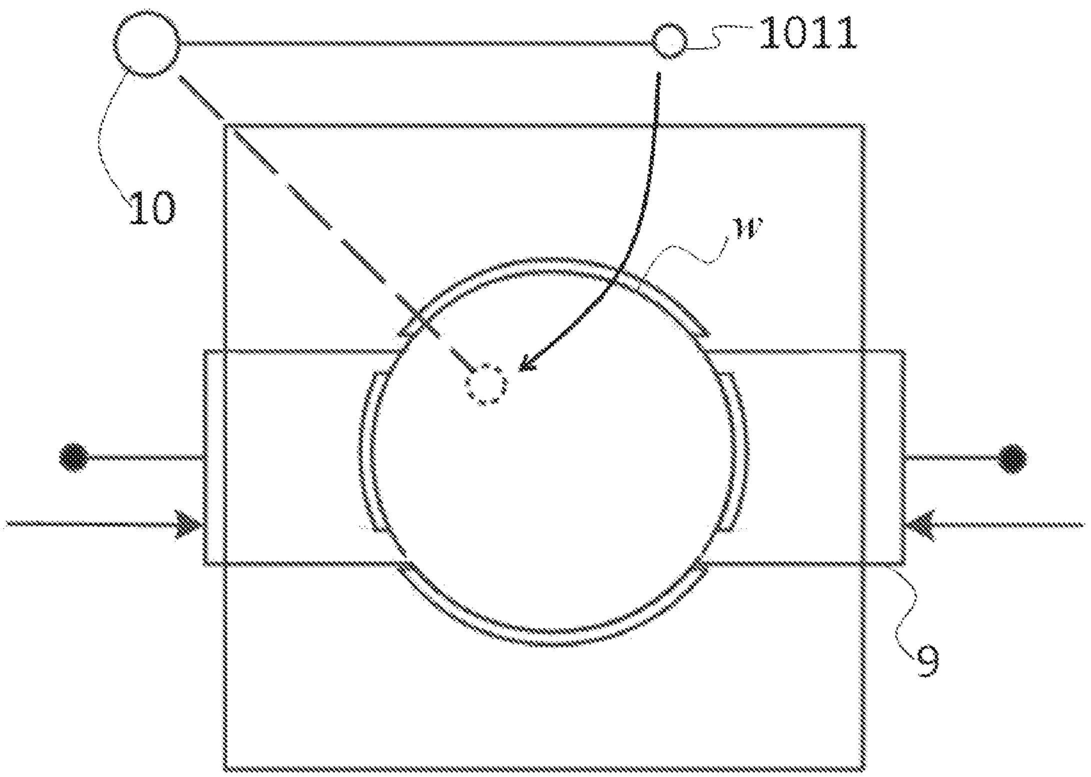
FIG. 7B is a top view of FIG. 7A in Embodiment 1 of the present invention.
Figure 8A:
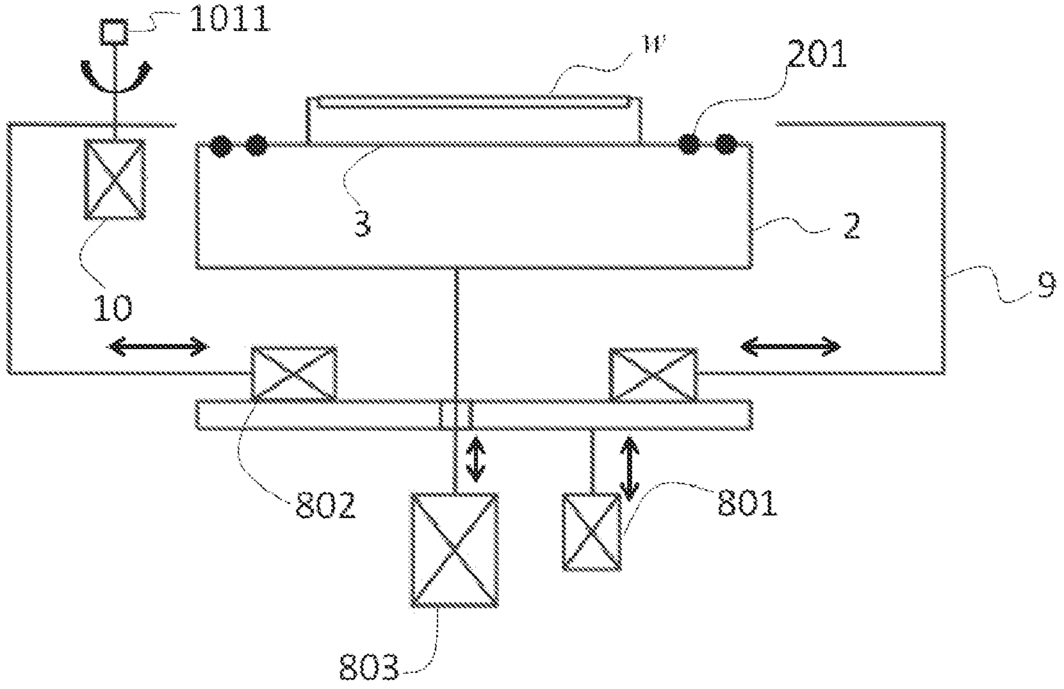
FIG. 8A is a schematic diagram of the support members provided in Embodiment 1 of the present invention placing the substrate on the substrate tray and then being drew out.

Specifically, as shown in FIG. 7A and FIG. 8A, the four support members 9 hold up the substrate w under the action of the first driving device 801, such as a motor, and place the substrate w on the substrate tray 3. As shown in FIG. 7B and FIG. 8B, after the substrate w is placed on the substrate tray 3, the second driving device 802 drives the support members 9 to draw out from the grooves 301 on the substrate tray 3. Then, the third driving device 803 lifts the base 2 upward in the vertical direction to close with the upper cover 1 to form the closed chamber 120. And then, the locks 110 are inserted into the lower side of the base 2, to make the substrate w be inside the pressure-resistant closed chamber 120 for subsequent drying processing.

After the drying process to the substrate w being completed, the second driving device 802 drives the support members 9 to insert into the grooves 301 of the substrate tray 3 to make the support members 9 be located at the bottom of the substrate w. The first driving device 801 drives the support members 9 to lift the substrate w, thereby taking the substrate w from the substrate tray 3. In this embodiment, the support members 9 may be support pins or ejector pins.

Figure 8B:
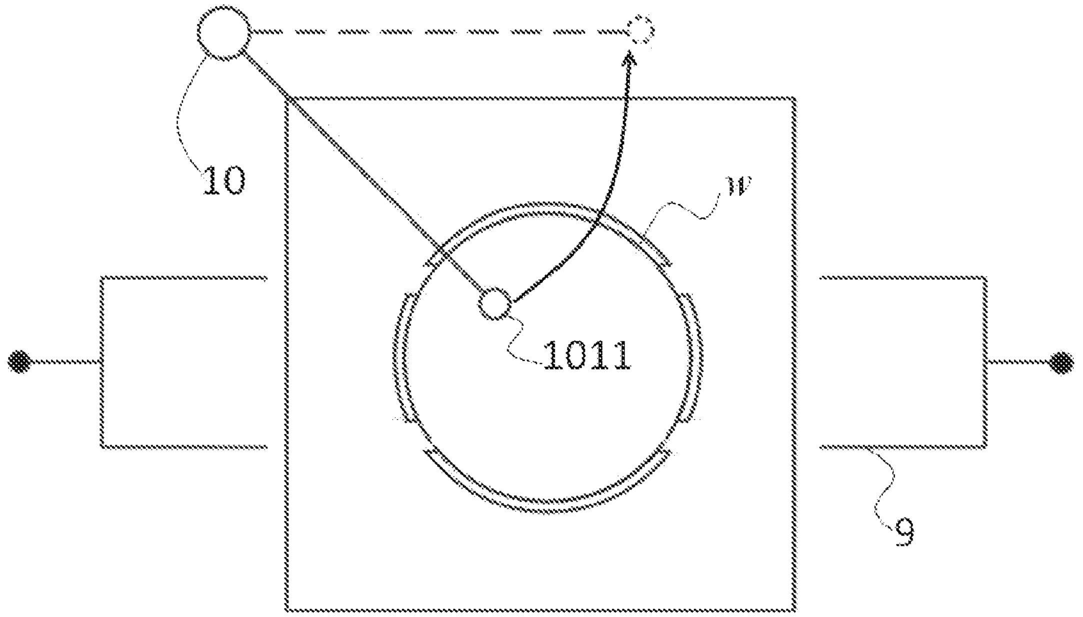
FIG. 8B is a top view of FIG. 8A in Embodiment 1 of the present invention.

As shown in FIG. 7A to FIG. 8B, the drying apparatus based on supercritical fluid is also provided with an IPA replenishing mechanism 10, which is configured to replenish the IPA in time when the IPA covering the surface of the substrate w cannot completely cover the surface of substrate w, to make the IPA on the surface of substrate w completely cover the surface of substrate w and reach a certain thickness. As shown in FIG. 7B and FIG. 8B, a nozzle 1011 of the IPA replenishing mechanism 10 can be rotatably adjusted. When the surface of the substrate w needs to be replenished with IPA, the nozzle 1011 of the IPA replenishing mechanism 10 rotates from the initial position to above the substrate w; after the IPA replenishment is completed, the nozzle 1011 of the IPA replenishing mechanism 10 rotates to the initial position.

As shown in FIG. 1A to FIG. 6, the base 2 is further provided with a plurality of sealing rings 201 for sealing the closed chamber 120 when the base 2 and the upper cover 1 move relative to each other to close the closed chamber 120.

As shown in FIG. 1A, FIG. 1B and FIG. 2, the drying apparatus based on supercritical fluid further comprises a heater 11, provided at the periphery of the upper cover 1 for heating the closed chamber 120, the first fluid supply tube 4 and the second fluid supply tube 6, to make the entire closed chamber 120 reach above the critical temperature during the drying process to the substrate w.

In this embodiment, the supercritical fluid is supercritical carbon dioxide.

Embodiment 2

Please refer to FIG. 1A to FIG. 8B, the Embodiment 2 also provides a drying apparatus based on supercritical fluid, compared with Embodiment 1, the difference is:

As shown in FIG. 1A and FIG. 1B, the base 2 and the upper cover 1 move relative to each other in the vertical direction, so as to close to form a pressure-resistant closed chamber 120; wherein the base 2 is kept fixed and the upper cover 1 moves downward in the vertical direction, so as to close to form the pressure-resistant closed chamber 120.

Other settings of this embodiment are the same as those of Embodiment 1 and will not be described again here.

Embodiment 3

Please refer to FIG. 1A to FIG. 8B, this Embodiment 3 provides a drying method based on supercritical fluid, the drying method based on supercritical fluid is implemented on the basis of the drying apparatus based on supercritical fluid in the above-mentioned Embodiment 1 or 2, the drying method comprises the following steps:

S1: The plurality of support members 9 hold up the substrate w to be dried under the action of the first driving device 801, and place the substrate w on the substrate tray 3. After placing the substrate w, the support members 9 is drew out from the grooves 301 on the substrate tray 3. Then, the base 2 and the upper cover 2 move relative to each other in the vertical direction, so as to close to form a pressure-resistant closed chamber 120, to make the substrate w be inside the pressure-resistant closed chamber 120. The closed chamber 120, the first fluid supply tube 4 and the second fluid supply tube 6 are heated, to make the interior of the closed chamber 120 reach a temperature above the critical temperature.

S2: Supply the supercritical fluid from above the closed chamber 120 to the interior of the closed chamber 120 through a first fluid supply tube 4. The fluid reaches the upper surface of the substrate w from the side of the substrate w after bypassing a fluid disturbance plate 5 below the first fluid supply tube 4. The continuous addition of supercritical fluid causes the pressure inside the closed chamber 120 to continuously increase until the pressure of the closed chamber 120 increases to above the critical pressure and to make the closed chamber 120 reach supercritical state. After the closed chamber 120 reaching supercritical state, the supercritical fluid supply from above the closed chamber 120 through the first fluid supply tube 4 is stopped.

S3: Supply the supercritical fluid from a first side of the closed chamber 120 to the interior of the closed chamber 120 through a second fluid supply tube 6 and perform drying process to the substrate w.

Wherein, the flow rate of the supercritical fluid entered through the second fluid supply tube 6 is greater than the flow rate of the supercritical fluid entered through the first fluid supply tube 4.

Meanwhile, as shown in FIG. 3 to FIG. 5B, the second fluid supply tube 6 supplies supercritical fluid from the first side of the closed chamber 120 sequentially through a plurality of first through holes 101 and a first cavity 102. The plurality of first through holes 101 and the first cavity 102 are connected to the second fluid supply tube 6. Furthermore, the flow rate angle of the supercritical fluid at the outlet of the first cavity 102 remains parallel to the upper surface of the substrate w. The supercritical fluid is discharged from the second side of the closed chamber 120 sequentially through the second cavity 104, the plurality of second through holes 103 and the fluid discharge tube 7, and the flow rate angle of the supercritical fluid discharged from the second cavity 104 is parallel to the upper surface of the substrate w, thus saving the usage amount of supercritical fluid and avoiding the waste of supercritical fluid.

S4: After the drying process is completed, close the second fluid supply tube 6, stopping suppling supercritical fluid from the first side of the closed chamber 120, and reducing the inner pressure of the closed chamber 120 to convert the supercritical fluid into gas that is discharged from the second side of the closed chamber 120 through the fluid discharge tube 7.

S5: When the inner pressure of the closed chamber 120 reaches the state of atmospheric pressure, the upper cover 1 and the base 2 move relative to each other in the vertical direction to open the closed chamber 120, and use the support members 9 to lift the substrate w to take the substrate w.

Before taking the substrate w in step S5, a plurality of loop operations from steps S2 to S4 can be performed according to process requirements to perform full drying process to the substrate w in the closed chamber 120.

As shown in FIG. 4 to FIG. 5B, the supercritical fluid is converted into gas and discharged from the second side of the closed chamber 120 through the second cavity 104, the plurality of second through holes 103 and the fluid discharge tube 7 in sequence, which effectively improves the discharge rate of the fluid discharge tube 7, and improves the process efficiency of the drying process to the substrate w.

Embodiment 4

Figure 9A:
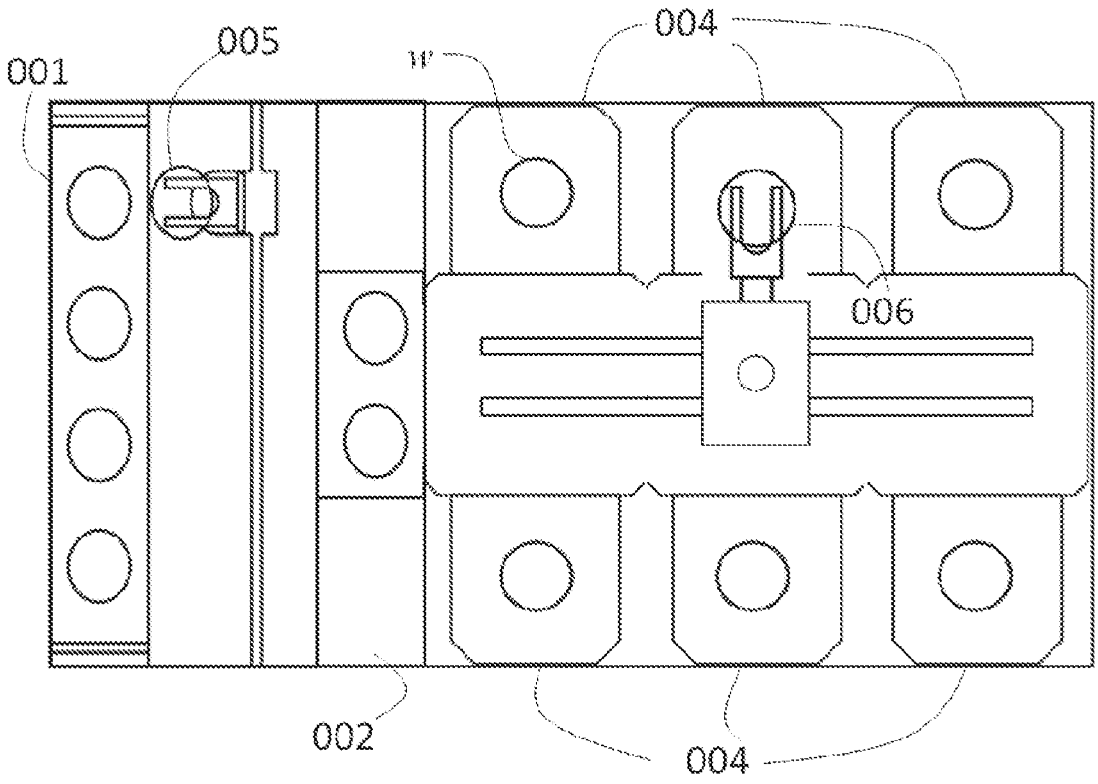
FIG. 9A is a top view of a cleaning and drying equipment provided in Embodiment 4 and Embodiment 8 of the present invention.
Figure 9B:
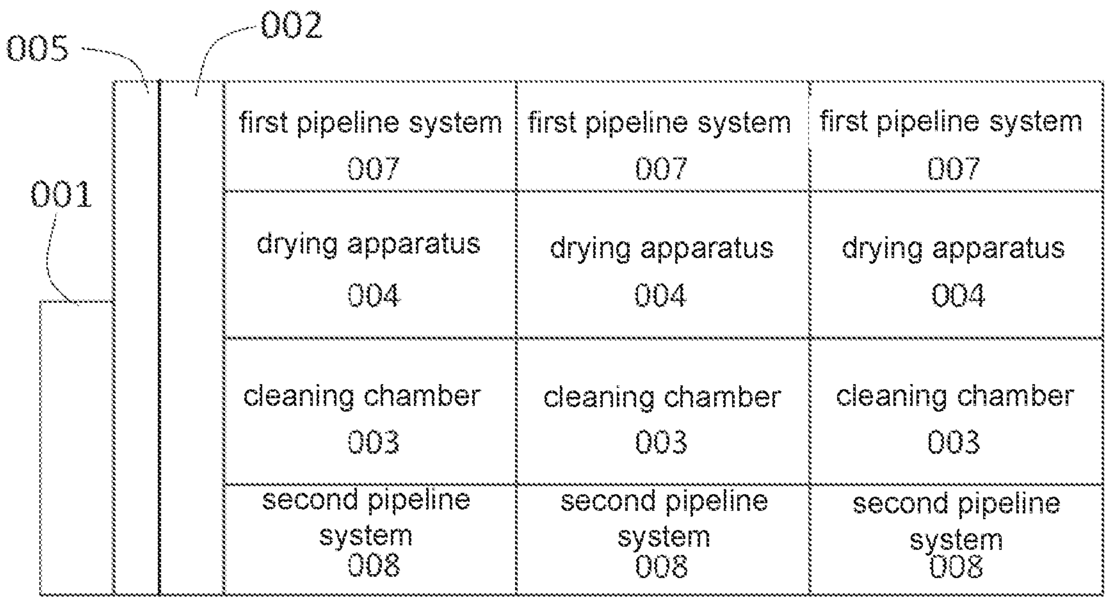
FIG. 9B is a front view of the cleaning and drying equipment provided in Embodiment 4 and Embodiment 8 of the present invention.

Please refer to FIG. 9A and FIG. 9B. Embodiment 4 provides a cleaning and drying equipment. The cleaning and drying equipment comprises: a substrate loading port 001, configured to place the substrate w; a buffer device 002; a front-end robot 005, configured to transfer the substrate w between the substrate loading port 001 and the buffer device 002; a cleaning chamber 003, configured to clean the substrate w; a drying apparatus 004 based on supercritical fluid disclosed in the above-mentioned Embodiment 1 or 2, configured to perform drying process to the cleaned substrate w. As shown in FIG. 1A to FIG. 8B, the drying apparatus 004 based on supercritical fluid comprises: an upper cover 1; a base 2, arranged below the upper cover 1; the base 2 and the upper cover 1 can move relative to each other in the vertical direction, so as to close to form a pressure-resistant closed chamber 120; a substrate tray 3, arranged on the base 2, and configured to bear the substrate w; and when the upper cover 1 and the base 2 are closed to form the closed chamber 120, the substrate w is located inside the closed chamber 120; a first fluid supply tube 4, arranged on the top wall of the upper cover 1 and configured to supply supercritical fluid to the interior of the closed chamber 120, the continuous addition of supercritical fluid causing the pressure inside the closed chamber 120 to continuously increase, until the pressure of the closed chamber 120 increasing to above the critical pressure of the fluid supplied to the closed chamber 120 via the first fluid supply tube 4 and to make the fluid reach a supercritical state; a fluid disturbance plate 5, arranged below the first fluid supply tube 4, and located between the first fluid supply tube 4 and substrate w, to make the supercritical fluid that enters from the first fluid supply tube 4 reach the upper surface of the substrate w from the side of the substrate w after bypassing the fluid disturbance plate 5, effectively buffering the impact of the supercritical fluid, and avoiding excessive flow of supercritical fluid being directly sprayed onto the upper surface of the substrate w; a second fluid supply tube 6, arranged on a first side wall of the upper cover 1, and configured to supply the supercritical fluid to the interior of the closed chamber 120 in the supercritical state, performing drying process to the surface of the substrate w inside the closed chamber 120; and a fluid discharge tube 7, arranged on a second side wall of the upper cover 1; a process robot 006, configured to transfer the substrate w among the buffer device 002, the cleaning chamber 003 and drying apparatus 004.

Specifically, the front-end robot 005 takes the substrate w to be cleaned from the substrate loading port 001 and places it in the buffer device 002. The process robot 006 takes the substrate w to be cleaned from the buffer device 002 and places it in the cleaning chamber 003 to perform cleaning process to the substrate w. After the cleaning process is completed, the process robot 006 takes the cleaned substrate w from the cleaning chamber 003 and places it on the support members 9 in the above-mentioned Embodiment 1 or 2. The cleaned substrate w is placed on the substrate tray 3 via the support members 9 to be performed drying process. After the drying process is completed, the process robot 006 takes the dried substrate w from the support members 9 and places it in the buffer device 002. And then the front-end robot 005 takes the dried substrate w from the buffer device 002 and places it in the substrate loading port 001.

As shown in FIG. 9A, there are a plurality of drying apparatuses 004 which are symmetrically arranged at both sides of the process robot 006. As shown in FIG. 9B, there are a plurality of cleaning chambers 003 which are arranged below the drying apparatuses 004 and correspond to the drying apparatuses 004 one by one.

In this Embodiment, there are six drying apparatuses 004 and six cleaning chambers 003. As shown in FIG. 9A, the six drying apparatuses 004 are symmetrically arranged along the process robot 006, so that there are three drying apparatuses 004 at each side of the process robot 006, and the cleaning chambers 003 and the drying apparatuses 004 correspond one by one. As shown in FIG. 9B, the drying apparatuses 004 are arranged above the corresponding cleaning chambers 003, and a plurality of first pipeline systems 007 are provided above the drying apparatuses 004 for supplying supercritical fluid to the interior of the drying apparatuses 004. A plurality of second pipeline systems 008 are provided below the cleaning chambers 003 for supplying chemical liquid to the interior of the cleaning chambers 003.

In the cleaning and drying equipment provided in Embodiment 4, the drying apparatuses 004 are arranged above the cleaning chambers 003, so that the process robot 006 can directly move the cleaned substrate upwards to the interior of the drying apparatuses 004, which speeds up the process speed and avoids the IPA on the substrate surface dripping.

Embodiment 5

Figure 9C:
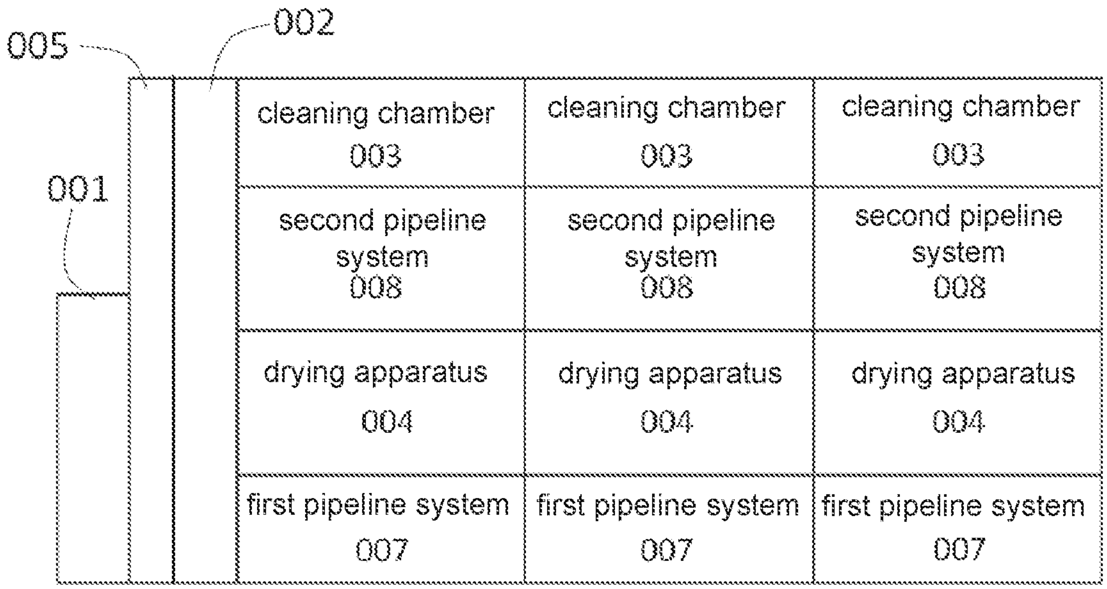
FIG. 9C is a front view of a cleaning and drying equipment provided in Embodiment 5 and Embodiment 9 of the present invention.

Please refer to FIG. 9A and FIG. 9C. This Embodiment also provides a cleaning and drying equipment. Compared with Embodiment 4, the difference is that:

As shown in FIG. 9A, there are a plurality of drying apparatuses 004 based on supercritical fluid, which are symmetrically arranged at both sides of the process robot 006. As shown in FIG. 9C, there are a plurality of cleaning chambers 003, which are arranged above the drying apparatuses 004 and correspond to the drying apparatuses 004 one by one.

In Embodiment 5, as shown in FIG. 9C, there are six drying apparatuses 004 and six cleaning chambers 003, and the six cleaning chambers 003 are arranged above the drying apparatuses 004. As shown in FIG. 9A, the six drying apparatuses 004 are symmetrically arranged along the process robot 006, so that there are three drying apparatuses 004 at each side of the process robot 006. The cleaning chambers 003 and the drying apparatuses 004 correspond one by one.

In Embodiment 5, the drying apparatuses 004 are arranged below the corresponding cleaning chambers 003, so that the process robot 006 can directly move the cleaned substrate w downward to the interior of the drying apparatuses 004.

Other settings of this Embodiment are the same as those of Embodiment 4 and will not be described again here.

Embodiment 6

Figure 10A:
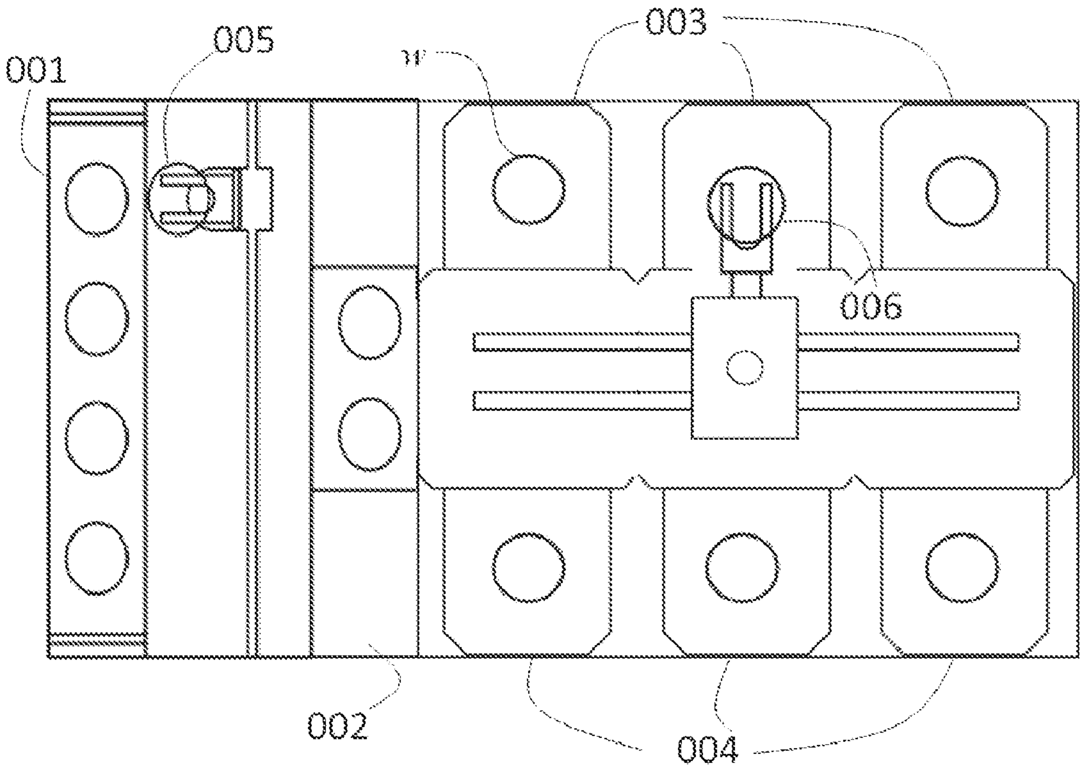
FIG. 10A is a top view of a cleaning and drying equipment provided in Embodiment 6 and Embodiment 10 of the present invention.
Figure 10B:
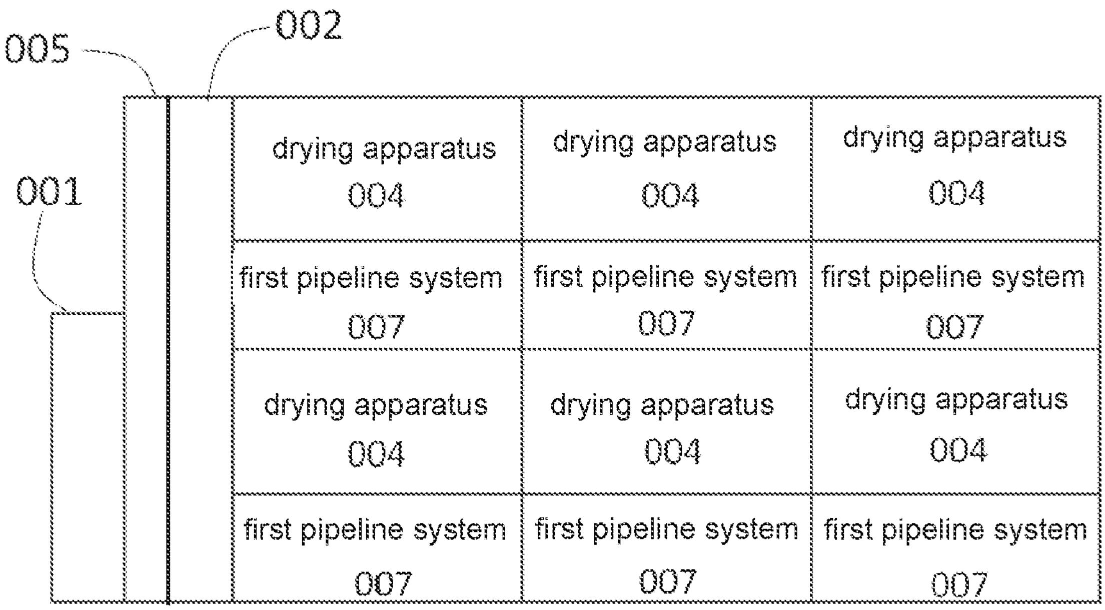
FIG. 10B is a front view of the cleaning and drying equipment provided in Embodiment 6 and Embodiment 10 of the present invention.

Please refer to FIG. 10A and FIG. 10B. Embodiment 6 also provides a cleaning and drying equipment. Compared with Embodiment 4, the difference is that:

As shown in FIG. 10A, there are a plurality of drying apparatuses 004, which are arranged at a first side of the process robot 006. There are a plurality of cleaning chambers 003 which are arranged at a second side of the process robot 006. The drying apparatuses 004 correspond to the cleaning chambers 003 one by one. Wherein, the plurality of drying apparatuses 004 are distributed in several layers along the vertical direction at the first side of the process robot 006; and the plurality of cleaning chambers 003 are distributed in several layers along the vertical direction at the second side of the process robot 006. In Embodiment 5, as shown in FIG. 10A and FIG. 10B, there are six drying apparatuses 004 at the first side of the process robot 006, and the six drying apparatuses 004 are distributed in two layers along the vertical direction at the first side of the process robot 006; and a plurality of first pipeline systems 007 are provided below every layer of the drying apparatuses 004 for supplying supercritical fluid to the interior of the drying apparatuses 004. At the second side which is not shown in FIG. 10B, there are six cleaning chambers 003, and the six cleaning chambers 003 are distributed in two layers along the vertical direction at the second side of the process robot 006.

Other settings of this Embodiment are the same as those of Embodiment 4 and will not be described again here.

Embodiment 7

Figure 11:
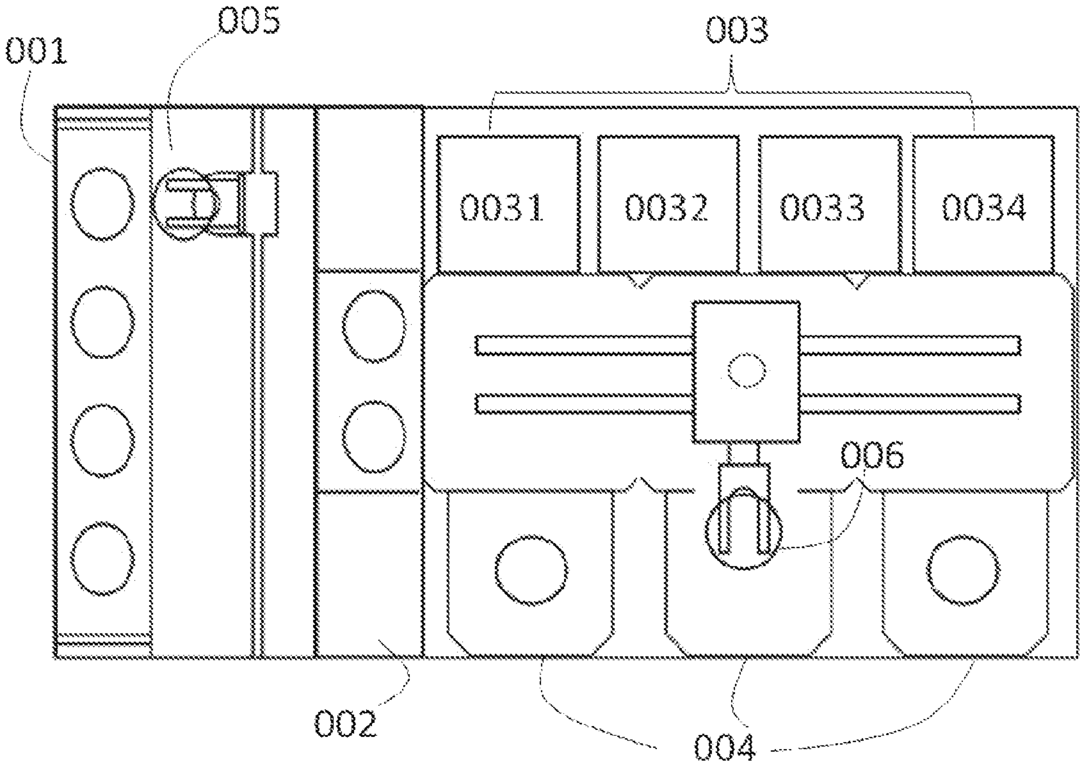
FIG. 11 is a top view of a cleaning and drying equipment provided in Embodiment 7 and Embodiment 11 of the present invention.

Please refer to FIG. 11. Embodiment 7 also provides a cleaning and drying equipment. Compared with Embodiment 6, the difference is that:

There are a plurality of drying apparatuses 004 which are arranged at a first side of the process robot 006; and there are a plurality of cleaning chambers 003 which are arranged at a second side of the process robot 006. Wherein, the plurality of drying apparatuses 004 are distributed in several layers along the vertical direction at the first side of the process robot 006; and the plurality of cleaning chambers 003 are distributed in several layers along the vertical direction at the second side of the process robot 006.

The cleaning chambers 003 can perform single substrate cleaning or batch substrates cleaning. Specifically, as shown in FIG. 11, the cleaning chambers 003 comprise one or more of the following structures for batch substrates cleaning: a chemical liquid cleaning tank 0031, a rapid deionized water rinse tank (DI-QDR) 0032, an IPA tank 0033 and a flipping IPA wetting mechanism 0034.

The chemical liquid in the chemical liquid cleaning tank 0031 can be any one or more of HF, DHF, SC1, SPM, phosphoric acid and SC2; and according to the needs of the process, the chemical liquid cleaning tank 0031 can include a plurality of cleaning tanks, and each cleaning tank can accommodate different chemical liquid. The rapid deionized water rinse tank (DI-QDR) 0032 is configured to remove particulate impurities and residual chemical liquid on the substrate surface to keep the substrate surface clean. The IPA tank 0033 uses the principle of co-dissolution of isopropyl alcohol (IPA) and water to remove moisture from the substrate surface after the cleaning process. The flipping IPA wetting mechanism 0034 is configured to keep the substrate surface being covered with IPA during the process of transferring the substrate from the IPA tank 0033 to the drying apparatuses 004.

Specifically, the front-end robot 005 takes the substrate w to be cleaned from the substrate loading port 001 and places it in the buffer device 002. The process robot 006 takes the substrate w to be cleaned from the buffer device 002 and places it in the phosphoric acid cleaning tank 0031, the rapid deionized water rinse tank (DI-QDR) 0032, the IPA tank 0033 and the flipping IPA wetting mechanism 0034 in sequence to perform cleaning process to the substrate w. After the cleaning process is completed, the process robot 006 takes the cleaned substrate w from the cleaning chamber 003 and places it in the drying apparatus 004 to perform drying process to the cleaned substrate w. After the drying process is completed, the process robot 006 takes the dried substrate w from the drying apparatus 004 and places it in the buffer device 002, and then the front-end robot 005 takes the dried substrate w from the buffer device 002 and places it in the substrate loading port 001.

In Embodiment 7, there are six drying apparatuses 004 and the six drying apparatuses 004 are distributed in two layers along the vertical direction on the first side of the process robot 006; and there are two cleaning chambers 003, and the two cleaning chambers 003 are distributed in two layers along the vertical direction on the second side of the process robot 006.

Other settings of this Embodiment are the same as those of Embodiment 6 and will not be described again here.

Embodiment 8

Please refer to FIG. 9A and FIG. 9B. Embodiment 8 also provides a cleaning and drying equipment. The cleaning and drying equipment comprises: a substrate loading port 001, configured to place the substrate w; a buffer device 002; a front-end robot 005, configured to transfer the substrate w between the substrate loading port 001 and the buffer device 002; a cleaning chamber 003, configured to clean the substrate w; a drying apparatus 004 based on supercritical fluid, configured to perform drying process to the cleaned substrate w; a process robot 006, configured to transfer the substrate w among the buffer device 002, the cleaning chamber 003 and drying apparatus 004.

Specifically, the front-end robot 005 takes the substrate w to be cleaned from the substrate loading port 001 and places it in the buffer device 002. The process robot 006 takes the substrate w to be cleaned from the buffer device 002 and places it in the cleaning chamber 003 to perform cleaning process to the substrate w. After the cleaning process is completed, the process robot 006 takes the cleaned substrate w from the cleaning chamber 003 and places it in the drying apparatus 004 to perform drying process to the substrate w. After the drying process is completed, the process robot 006 takes the dried substrate w from the drying apparatus 004 and places it in the buffer device 002. And then the front-end robot 005 takes the substrate w from the buffer device 002 and places it in the substrate loading port 001.

As shown in FIG. 9A, there are a plurality of drying apparatuses 004 which are symmetrically arranged at both sides of the process robot 006. As shown in FIG. 9B, there are a plurality of cleaning chambers 003 which are arranged below the drying apparatuses 004 and correspond to the drying apparatuses 004 one by one.

In Embodiment 8, there are six drying apparatuses 004 and six cleaning chambers 003. As shown in FIG. 9A, the six drying apparatuses 004 are symmetrically arranged along the process robot 006, so that there are three drying apparatuses 004 at each side of the process robot 006, and the cleaning chambers 003 and the drying apparatuses 004 correspond one by one. As shown in FIG. 9B, the drying apparatuses 004 are arranged above the corresponding cleaning chambers 003, and a plurality of first pipeline systems 007 are provided above the drying apparatuses 004 for supplying supercritical fluid to the interior of the drying apparatuses 004. A plurality of second pipeline systems 008 are provided below the cleaning chambers 003 for supplying chemical liquid to the interior of the cleaning chambers 003.

In the cleaning and drying equipment provided in Embodiment 8, the drying apparatuses 004 are arranged above the cleaning chambers 003, so that the process robot 006 can directly move the cleaned substrate upwards to the interior of the drying apparatuses 004, which speeds up the process speed and avoids the IPA on the substrate surface dripping.

Embodiment 9

Please refer to FIG. 9A and FIG. 9C. Embodiment 9 also provides a cleaning and drying equipment. Compared with Embodiment 8, the difference is that:

As shown in FIG. 9A, there are a plurality of drying apparatuses 004 based on supercritical fluid, which are symmetrically arranged at both sides of the process robot 006. As shown in FIG. 9C, there are a plurality of cleaning chambers 003 which are arranged above the drying apparatuses 004 and correspond to the drying apparatuses 004 one by one.

In Embodiment 9, as shown in FIG. 9C, there are six drying apparatuses 004 and six cleaning chambers 003, and the six cleaning chambers 003 are arranged above the drying apparatuses 004. As shown in FIG. 9A, the six drying apparatuses 004 are symmetrically arranged along the process robot 006, so that there are three drying apparatuses 004 at each side of the process robot 006, and the cleaning chambers 003 and the drying apparatuses 004 correspond one by one.

Other settings of this Embodiment are the same as those of Embodiment 8 and will not be described again here.

Embodiment 10

Please refer to the FIG. 10A and FIG. 10B. Embodiment 10 also provides a cleaning and drying equipment. The cleaning and drying equipment comprises: a substrate loading port 001, configured to place the substrate w; a buffer device 002; a front-end robot 005, configured to transfer the substrate w between the substrate loading port 001 and the buffer device 002; a cleaning chamber 003, configured to clean the substrate w; a drying apparatus 004 based on supercritical fluid, configured to perform drying process to the cleaned substrate w; a process robot 006, configured to transfer the substrate w among the buffer device 002, the cleaning chamber 003 and drying apparatus 004.

Specifically, the front-end robot 005 takes the substrate w to be cleaned from the substrate loading port 001 and places it in the buffer device 002. The process robot 006 takes the substrate w to be cleaned from the buffer device 002 and places it in the cleaning chamber 003 to perform cleaning process to the substrate w. After the cleaning process is completed, the process robot 006 takes the cleaned substrate w from the cleaning chamber 003 and places it in the drying apparatus 004 to perform drying process to the substrate w. After the drying process is completed, the process robot 006 takes the dried substrate w from the drying apparatus 004 and places it in the buffer device 002. And then the front-end robot 005 takes the substrate w from the buffer device 002 and places it in the substrate loading port 001.

As shown in FIG. 10A, there are a plurality of drying apparatuses 004 which are arranged at a first side of the process robot 006; and there are a plurality of cleaning chambers 003 which are arranged at a second side of the process robot 006; and the drying apparatuses 004 correspond to the cleaning chambers 003 one by one. The plurality of drying apparatuses 004 are distributed in several layers along the vertical direction at the first side of the process robot 006; and the plurality of cleaning chambers 003 are distributed in several layers along the vertical direction at the second side of the process robot 006.

In Embodiment 10, as shown in FIG. 10A and FIG. 10B, there are six drying apparatuses 004, and the six drying apparatuses 004 are distributed in two layers along the vertical direction at the first side of the process robot 006; and a plurality of first pipeline systems 007 are provided below every layer of the drying apparatuses 004 for supplying supercritical fluid to the interior of the drying apparatuses 004. There are six cleaning chambers 003, and the six cleaning chambers 003 are distributed in two layers along the vertical direction at the second side of the process robot 006.

Embodiment 11

Please refer to FIG. 11. Embodiment 11 also provides a cleaning and drying equipment. Compared with Embodiment 10, the difference is that:

There are a plurality of drying apparatuses 004 which are arranged at a first side of the process robot 006; and there are a plurality of cleaning chambers 003 which are arranged at a second side of the process robot 006.

The cleaning chambers 003 can perform single substrate cleaning or batch substrates cleaning. Specifically, as shown in FIG. 11, the cleaning chambers 003 comprise one or more of the following structures for batch substrates cleaning: a chemical liquid cleaning tank 0031, a rapid deionized water rinse tank (DI-QDR) 0032, an IPA tank 0033 and a flipping IPA wetting mechanism 0034.

The chemical liquid in the chemical liquid cleaning tank 0031 can be any one or more of HF, DHF, SC1, SPM, phosphoric acid and SC2; and according to the needs of the process, the chemical liquid cleaning tank 0031 can include a plurality of cleaning tanks, and each cleaning tank can accommodate different chemical liquid. The rapid deionized water rinse tank (DI-QDR) 0032 is configured to remove particulate impurities and residual chemical liquid on the substrate surface to keep the substrate surface clean. The IPA tank 0033 uses the principle of co-dissolution of isopropyl alcohol (IPA) and water to remove moisture from the substrate surface after the cleaning process. The flipping IPA wetting mechanism 0034 is configured to keep the substrate surface being covered with IPA during the process of transferring the substrate from the IPA tank 0033 to the drying apparatuses 004.

Specifically, the front-end robot 005 takes the substrate w to be cleaned from the substrate loading port 001 and places it in the buffer device 002; the process robot 006 takes the substrate w to be cleaned from the buffer device 002 and places it in the phosphoric acid cleaning tank 0031, the rapid deionized water rinse tank (DI-QDR) 0032, the IPA tank 0033 and the flipping IPA wetting mechanism 0034 in sequence to perform cleaning process to the substrate w. After the cleaning process is completed, the process robot 006 takes the cleaned substrate w from the cleaning chambers 003 and places it in the drying apparatuses 004 to perform drying process to the cleaned substrate w. After the drying process is completed, the process robot 006 takes the dried substrate w from the drying apparatuses 004 and places it in the buffer device 002, and then the front-end robot 005 takes the dried substrate w from the buffer device 002 and places it in the substrate loading port 001.

In Embodiment 11, there are six drying apparatuses 004 and the six drying apparatuses 004 are distributed in two layers along the vertical direction at the first side of the process robot 006; and there are two cleaning chambers 003, and the two cleaning chambers 003 are distributed in two layers along the vertical direction at the second side of the process robot 006.

Other settings of this Embodiment are the same as those of Embodiment 10 and will not be described again here.

Although the content of the present invention has been described in detail through the above preferred embodiments, it should be recognized that the above description should not be considered as limiting the present invention. Various modifications and alternatives to the present invention will be obvious to those skilled in the art after reading the above. Therefore, the protection scope of the present invention should be defined by the attached claims.

What is claimed is:

1. A drying apparatus based on supercritical fluid, comprising:

an upper cover;

a base, arranged below the upper cover, the base and the upper cover being capable of moving relatively in the vertical direction so as to close to form a pressure-resistant closed chamber;

a substrate tray, arranged on the base, and configured to bear a substrate;

a first fluid supply tube, arranged on the top wall of the upper cover, and configured to supply supercritical fluid to the interior of the closed chamber to make the closed chamber reach a supercritical state from an atmospheric pressure state;

a fluid disturbance plate, arranged below the first fluid supply tube;

a second fluid supply tube, arranged on a first side wall of the upper cover, and configured to supply the supercritical fluid to the interior of the closed chamber in the supercritical state, so as to perform drying process to the substrate inside the closed chamber;

a fluid discharge tube, arranged on a second side wall of the upper cover;

a plurality of first through holes are evenly and horizontally distributed on the first side wall of the upper cover, and the plurality of first through holes are connected to the second fluid supply tube, which are used for the supercritical fluid evenly entering the interior of the closed chamber through the plurality of first through holes; and a first cavity is provided on the first side wall of the upper cover, and the bottom surface of the first cavity is parallel to the upper surface of the substrate, which is used for the supercritical fluid that enters from the first through holes being evenly distributed on the upper surface of the substrate after passing through the first cavity.

2. The drying apparatus based on supercritical fluid according to claim 1, wherein a gap between the fluid disturbance plate and the substrate is less than a set value.

3. The drying apparatus based on supercritical fluid according to claim 2, wherein the set value is 0-10 mm.

4. The drying apparatus based on supercritical fluid according to claim 1, wherein the first through holes are conical holes.

5. The drying apparatus based on supercritical fluid according to claim 1, wherein a plurality of second through holes are evenly and horizontally distributed on the second side wall of the upper cover, and the plurality of second through holes are connected to the fluid discharge tube.

6. The drying apparatus based on supercritical fluid according to claim 5, wherein a second cavity is provided on the second side wall of the upper cover, and the bottom surface of the second cavity is parallel to the upper surface of the substrate.

7. The drying apparatus based on supercritical fluid according to claim 5, wherein the second through holes are conical holes.

8. The drying apparatus based on supercritical fluid according to claim 1, wherein the tube diameter of the second fluid supply tube is larger than the tube diameter of the first fluid supply tube.

9. The drying apparatus based on supercritical fluid according to claim 1, wherein the upper cover is fixed and the base is adapted to move upward in the vertical direction, so as to close to form the closed chamber.

10. The drying apparatus based on supercritical fluid according to claim 1, wherein the base is fixed and the upper cover is adapted to move downward in the vertical direction, so as to close to form the closed chamber.

11. The drying apparatus based on supercritical fluid according to claim 1, wherein locks are provided on the upper cover, which are used for fastening the base when the upper cover and the base move relatively to form the closed chamber, thereby locking the closed chamber.

12. The drying apparatus based on supercritical fluid according to claim 1, wherein the appearance of the upper cover is a square cover, the base is a square plate, and the hollow part of the closed chamber is a circular shape chamber.

13. The drying apparatus based on supercritical fluid according to claim 1, wherein the supercritical fluid is supercritical carbon dioxide.

14. The drying apparatus based on supercritical fluid according to claim 1, wherein the base and the substrate tray are integrally formed.

15. A cleaning and drying equipment, comprising:

a substrate loading port, configured to place a substrate;

a buffer device;

a front-end robot, configured to transfer the substrate between the substrate loading port and the buffer device;

a cleaning chamber, configured to perform cleaning process to the substrate;

a drying apparatus based on supercritical fluid, configured to perform drying process to the cleaned substrate, the drying apparatus comprising:

an upper cover;

a base, arranged below the upper cover, the base and the upper cover being capable of moving relatively in the vertical direction, so as to close to form a pressure-resistant closed chamber;

a substrate tray, arranged on the base, and configured to bear a substrate;

a first fluid supply tube, arranged on the top wall of the upper cover, and configured to supply supercritical fluid to the interior of the closed chamber to make the closed chamber reach a supercritical state from an atmospheric pressure state;

a fluid disturbance plate, arranged below the first fluid supply tube;

a second fluid supply tube, arranged on a first side wall of the upper cover, and configured to supply the supercritical fluid to the interior of the closed chamber in the supercritical state, so as to perform drying process to the substrate inside the closed chamber;

a fluid discharge tube, arranged on a second side wall of the upper cover;

a plurality of first through holes are evenly and horizontally distributed on the first side wall of the upper cover, and the plurality of first through holes are connected to the second fluid supply tube, which are used for the supercritical fluid evenly entering the interior of the closed chamber through the plurality of first through holes;

a first cavity is provided on the first side wall of the upper cover, and the bottom surface of the first cavity is parallel to the upper surface of the substrate, which is used for the supercritical fluid that enters from the first through holes being evenly distributed on the upper surface of the substrate after passing through the first cavity; and a process robot, configured to transfer the substrate among the buffer device, the cleaning chamber and the drying apparatus.

16. The cleaning and drying equipment according to claim 15, wherein there are a plurality of drying apparatuses, which are symmetrically arranged at both sides of the process robot; there are a plurality of cleaning chambers, which are arranged above or below the drying apparatuses and correspond to the drying apparatuses one by one.

17. The cleaning and drying equipment according to claim 16, wherein there are six drying apparatuses, and three drying apparatuses are arranged at each side of the process robot; there are six cleaning chambers which correspond to the drying apparatuses one by one.

18. The cleaning and drying equipment according to claim 15, wherein the drying apparatuses are arranged at a first side of the process robot; the cleaning chambers are arranged at a second side of the process robot; and the drying apparatuses correspond to the cleaning chambers one by one.

19. The cleaning and drying equipment according to claim 18, wherein the cleaning chambers are used for single substrate cleaning or batch substrates cleaning.

20. The cleaning and drying equipment according to claim 19, wherein the cleaning chambers comprise one or more of the following structures for batch substrates cleaning: a chemical liquid cleaning tank, a rapid deionized water rinse tank, an IPA tank and a flipping IPA wetting mechanism.

21. The cleaning and drying equipment according to claim 18, wherein there are a plurality of drying apparatuses, which are distributed in a plurality of layers in the vertical direction at the first side of the process robot; and there are a plurality of cleaning chambers which are distributed in a plurality of layers in the vertical direction at the second side of the process robot.

22. The cleaning and drying equipment according to claim 21, wherein there are six drying apparatuses, and the six drying apparatuses are distributed in two layers in the vertical direction at the first side of the process robot; there are six cleaning chambers, and the six cleaning chambers are distributed in two layers in the vertical direction at the second side of the process robot.

* * * * *